United States Patent
Eacock et al.

(10) Patent No.: US 11,646,291 B2
(45) Date of Patent: May 9, 2023

(54) METHOD FOR CALIBRATING AN ULTRASONIC BONDING MACHINE

(71) Applicant: Infineon Technologies AG, Neubiberg (DE)

(72) Inventors: Florian Eacock, Paderborn (DE); Michal Chajneta, Lippstadt (DE); Stefan Tophinke, Paderborn (DE)

(73) Assignee: Infineon Technologies AG, Neubiberg (DE)

( * ) Notice: Subject to any disclaimer, the term of this patent is extended or adjusted under 35 U.S.C. 154(b) by 781 days.

(21) Appl. No.: 16/527,289

(22) Filed: Jul. 31, 2019

(65) Prior Publication Data
US 2020/0043883 A1    Feb. 6, 2020

(30) Foreign Application Priority Data

Jul. 31, 2018  (EP) .................................... 18186443

(51) Int. Cl.
*H01L 23/00*       (2006.01)
*G05B 19/18*      (2006.01)

(52) U.S. Cl.
CPC ............ *H01L 24/78* (2013.01); *G05B 19/182* (2013.01); *G05B 2219/37008* (2013.01);
(Continued)

(58) Field of Classification Search
CPC ........... H01L 24/78; H01L 2224/78001; H01L 2224/78343; H01L 2224/48472;
(Continued)

(56) References Cited

U.S. PATENT DOCUMENTS

| 4,696,425 A | 9/1987 | Landes |
| 4,958,762 A * | 9/1990 | Shimizu .................. H01L 24/78 228/1.1 |

(Continued)

FOREIGN PATENT DOCUMENTS

| CN | 103377959 A | 10/2013 |
| CN | 103531494 A | 1/2014 |
| EP | 1897648 A1 | 3/2008 |

*Primary Examiner* — Bitew A Dinke
(74) *Attorney, Agent, or Firm* — Murphy, Bilak & Homiller, PLLC

(57) ABSTRACT

A method for calibrating a second bonding machine based on a calibrated first bonding machine is disclosed. The first bonding machine includes a first ultrasonic transducer. The second bonding machine includes a second ultrasonic transducer and a power supply. The method includes providing a first electrical calibration supply that causes the first ultrasonic transducer to oscillate at a first calibration amplitude when it is damped by a mechanical damping, providing a second electrical calibration supply that causes the second ultrasonic transducer to oscillate at the same calibration amplitude when it is damped by the same mechanical damping. The second bonding machine is adapted to modify a second control signal based on a first electrical parameter of the first electrical calibration supply and on a second electrical parameter of the second electrical calibration supply in order to generate a modified second control signal, provide the modified second control signal to the power supply in order to cause the second power supply to generate a second electrical supply, and provide the second electrical supply to the second ultrasonic transducer.

20 Claims, 8 Drawing Sheets

(52) U.S. Cl.
CPC .............. *G05B 2219/45033* (2013.01); *H01L 2224/78001* (2013.01); *H01L 2224/78343* (2013.01)

(58) Field of Classification Search
CPC ... H01L 2224/783–78301; H01L 2224/85205; G05B 19/182; G05B 2219/37008; G05B 2219/45033; B06B 1/0223; B06B 3/02; B06B 2201/40; B06B 2201/72; B23K 20/10
See application file for complete search history.

(56) References Cited

U.S. PATENT DOCUMENTS

| | | | | |
|---|---|---|---|---|
| 5,046,654 A * | 9/1991 | Yamazaki | ............... | H01L 24/78 228/1.1 |
| 5,115,960 A * | 5/1992 | Shimizu | ............... | H01L 24/85 228/904 |
| 5,199,630 A * | 4/1993 | Felber | ............... | H01L 24/85 228/103 |
| 5,323,952 A * | 6/1994 | Kato | ............... | H01L 24/85 228/180.5 |
| 5,326,015 A | 7/1994 | Weaver et al. | | |
| 5,357,423 A * | 10/1994 | Weaver | ............... | B23K 20/10 318/116 |
| 5,386,936 A * | 2/1995 | Mochida | ............... | B23K 20/10 228/110.1 |
| 5,431,324 A * | 7/1995 | Kajiwara | ............... | B23K 20/10 228/103 |
| 5,446,403 A | 8/1995 | Witkowski | | |
| 5,699,953 A * | 12/1997 | Safabakhsh | ............... | H01L 24/78 228/180.5 |
| 5,816,476 A * | 10/1998 | Buice | ............... | H01L 24/78 228/110.1 |
| 5,944,249 A * | 8/1999 | Macabitas | ............... | H01L 24/78 228/180.5 |
| 7,845,542 B2 * | 12/2010 | Evans, Jr. | ............... | H01L 24/85 228/103 |
| 2001/0016786 A1* | 8/2001 | Takahashi | ............... | B23K 20/10 700/192 |
| 2002/0162875 A1* | 11/2002 | Miller | ............... | B23K 20/10 228/180.5 |
| 2005/0133563 A1* | 6/2005 | Kim | ............... | H01L 24/78 228/110.1 |
| 2010/0051670 A1* | 3/2010 | Okafuji | ............... | H01L 24/85 228/1.1 |
| 2010/0127599 A1* | 5/2010 | Thuerlemann | ............... | B06B 3/00 310/323.18 |
| 2011/0000951 A1* | 1/2011 | Qin | ............... | B23K 20/007 228/103 |
| 2011/0056267 A1 | 3/2011 | Qin et al. | | |
| 2011/0062216 A1* | 3/2011 | Sano | ............... | B23K 20/007 228/1.1 |
| 2012/0074206 A1* | 3/2012 | Qin | ............... | H01L 24/85 228/102 |
| 2012/0125977 A1* | 5/2012 | DeAngelis | ............... | B23K 20/007 228/110.1 |
| 2013/0277414 A1* | 10/2013 | Brunner | ............... | H01L 24/45 228/102 |
| 2014/0138426 A1* | 5/2014 | Hagiwara | ............... | H01L 24/85 228/160 |
| 2014/0209663 A1* | 7/2014 | Song | ............... | H01L 24/78 228/1.1 |
| 2016/0358880 A1* | 12/2016 | Sekine | ............... | H01L 24/85 |
| 2018/0151532 A1* | 5/2018 | Jindo | ............... | B23K 1/0016 |
| 2018/0182731 A1* | 6/2018 | Matsubara | ............... | H01L 24/85 |
| 2018/0272463 A1* | 9/2018 | Ichinose | ............... | B23K 20/26 |
| 2019/0237428 A1* | 8/2019 | Fujino | ............... | B23K 20/005 |
| 2019/0287941 A1* | 9/2019 | Maruya | ............... | B23K 20/26 |
| 2021/0272927 A1* | 9/2021 | Aoyagi | ............... | B23K 20/004 |

* cited by examiner

METHOD FOR CALIBRATING AN ULTRASONIC BONDING MACHINE

TECHNICAL FIELD

This disclosure in general relates to ultrasonic bonding techniques.

BACKGROUND

Ultrasonic bonding techniques are widely employed to mechanically join two bonding partners. Thereby, a bonding tool oscillating at an ultrasonic frequency mechanically presses a second bonding partner with a pressing force against a first bonding partner. For example, the first bonding partner may be a semiconductor chip or an electronic circuit board and the second bonding partner may be a bonding wire. However, the quality of a joint between two bonding partners may depend on many parameters like the technical design of the bonding partners, the technical design of the bonding tool, the oscillation frequency of the bonding tool, the pressing force, etc. For example, bonding wires of different types (e.g. different materials, different diameters/cross-sections) to a particular type of semiconductor chip may require different production parameters (e.g. oscillation frequency, pressing force) in order to achieve reliable joints. Therefore, each particular combination of a first and second type bonding partner may require extensive experiments (e.g. test series varying the pressing force and the oscillation frequency) in order to find proper production parameters.

Nevertheless, using one or more control signals found to deliver suitable bonding results for joining the bonding partners of a particular combination of a first and second type bonding partner using a first bonding machine may be inappropriate when employed to join bonding partners of identical type using a different bonding machine. In other words, optimizing the quality of identical joints produced with different bonding machines may require repeating the above-mentioned extensive experiments for each of the employed bonding machines. Hence, there is a need for improved solutions.

SUMMARY

One aspect relates to a method for calibrating a second bonding machine based on a calibrated first bonding machine. The first bonding machine includes a first ultrasonic transducer, the second bonding machine includes a second ultrasonic and a power supply. The method includes: damping the first ultrasonic transducer by a first mechanical damping; providing a first electrical calibration supply to the first ultrasonic transducer, the first electrical calibration supply causing the first ultrasonic transducer, when it is damped by the first mechanical damping, to oscillate at a first calibration amplitude; providing a second electrical calibration supply to the second ultrasonic transducer, wherein the second electrical calibration supply is configured to cause the second ultrasonic transducer, when it is damped by a second mechanical damping identical to the first mechanical damping, to oscillate at a second calibration amplitude identical to the first calibration amplitude. The second bonding machine is adapted to modify a second control signal based on a first electrical parameter of the first electrical calibration supply and on a second electrical parameter of the second electrical calibration supply, in order to generate a modified second control signal; provide the modified second control signal to the power supply in order to cause the power supply to generate a second electrical supply; and provide the second electrical supply to the second ultrasonic transducer.

The invention can be better understood with reference to the following description and drawings. The components in the figures are not necessarily to scale, emphasis instead being placed upon illustrating the principles of the invention. Moreover, in the figures, like reference numerals designate corresponding parts. In the present description and the claims, some elements are designated as "first element", "second element", "third element", etc. It should be pointed out that designations like "first", "second", "third", etc. are not intended to be enumerative, but solely serve to identify individual "elements". That is, e.g., the existence of a "third element" does not require the presence of a "first element" and a "second element".

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise.

Figure 1:
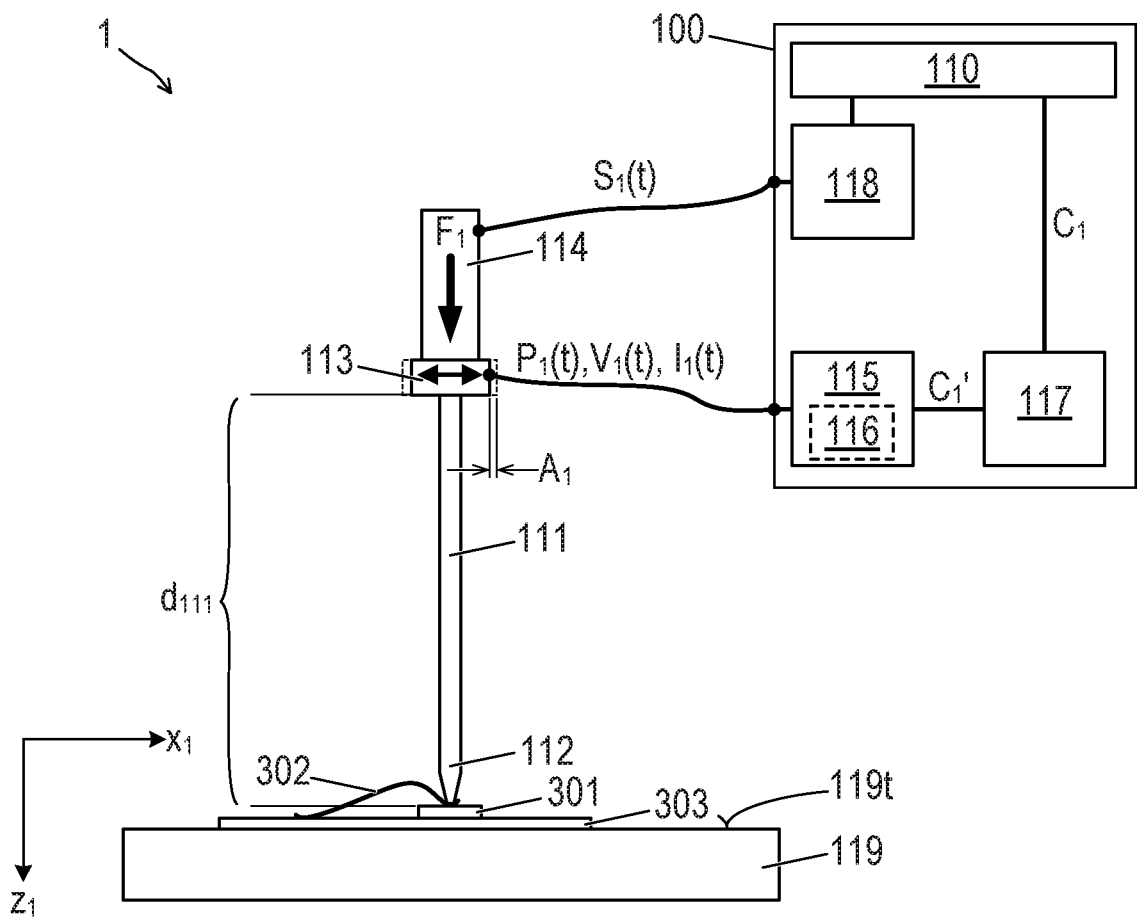
FIG. 1 illustrates a normal operation of a first bonding machine.

FIG. 1 schematically illustrates a first bonding machine 1. The first bonding machine 1 includes a first bonding tool 111, a (e.g. piezoelectric or magnetostrictive) first ultrasonic transducer 113, a first pressing device 114, a first support 119 and a first drive unit 100. The first drive unit 100 includes a first control unit 110, a first power supply 115, a first power correction unit 117 and a first pressing device driver 118. Controlled by the first control unit 110, the first power supply 115 generates a first electrical supply power $P_1(t)$ that is directly provided to the first ultrasonic transducer 113. In order to cause the first power supply 115 to generate the first electrical supply power $P_1(t)$, the first control unit 110 generates and outputs a first control signal $C_1$, and the first power supply 115 generates the first electrical supply power $P_1(t)$ based on the first control signal $C_1$.

According to the illustrated embodiment, the first control signal $C_1$ may be provided to the first power correction unit 117 which generates, based on the first control signal $C_1$, a modified first control signal $C_1'$ that is provided to the first power supply 115 as a first power supply input signal. The first power correction unit 117 is optional and may implement a calibration of the first bonding machine 1. The first power supply 115 generates the first electrical supply power $P_1(t)$ based on the first power supply input signal, i.e., in the illustrated embodiment, based on the modified first control signal $C_1'$ which is supplied to the input of the first power supply 115. Therefore, the first power supply 115 generates the first electrical supply power $P_1(t)$ also based on the first control signal $C_1$. That is, the first electrical supply power $P_1(t)$ may change depending on the first control signal $C_1$.

As already explained above, the first power correction unit 117 is optional. According to one embodiment (not illustrated), the first power correction unit 117 may be omitted and the first control signal $C_1$ may be directly provided to the input of the first power supply 115 as the first power supply input signal. Also in this embodiment, the first power supply 115 generates the first electrical supply power $P_1(t)$ based on the first control signal $C_1$.

The first electrical power $P_1(t)$ causes the first ultrasonic transducer 113 to oscillate at a first ultrasonic frequency $f_1$ in a first lateral direction $x_1$. In FIG. 1, a double arrow schematically illustrates the direction of the oscillation, and a dashed line schematically illustrates the region of oscillation of the oscillating first ultrasonic transducer 113. The first ultrasonic transducer 113 is mechanically coupled to the first bonding tool 111 so that the first bonding tool 111 is forced to oscillate at the oscillation frequency (i.e. the first ultrasonic frequency $f_1$) of the first ultrasonic transducer 113. FIG. 1, in which the first ultrasonic transducer 113 is depicted in its neutral position of oscillation, also illustrates the first oscillation amplitude $A_1$ of the first ultrasonic transducer 113 in the first lateral direction $x_1$.

During normal operation of the first bonding machine 1, i.e. when the first bonding machine 1 is forming a bonded connection between a first bonding partner 301 and a second bonding partner 302, the first bonding partner 301 is (directly or indirectly) placed on and fixed (e.g. clamped, sucked, adhered, etc.) to a first surface 1191 of the first support 119. The second bonding partner 302 (i.e. at least a section of the second bonding partner 302) is, e.g. subsequently, placed between a first tool tip 112 of the first bonding tool 111 and the first bonding partner 301 and pressed against the first bonding partner 301 by the first tool tip 112 with a first pressing force $F_1$. Thereby, the second bonding partner 302 physically contacts the first bonding partner 301. According to the provided example and without being restricted to it, the first bonding partner 301 may be a semiconductor chip and the second bonding partner 302 may be a bonding wire. Optionally, the first bonding partner 301 may be, prior to being placed on the surface $119t$ of the support 119, pre-mounted (e.g. soldered or sintered or adhered) on a carrier 303 (e.g. a metal plate, a circuit board, a metallized ceramic substrate or any other kind of carrier) and then, together with the carrier 303, placed on the first surface $119t$ so that the carrier 303 is arranged between the first surface 1191 and the first bonding partner 301.

With the first pressing force $F_1$ applied, the first ultrasonic transducer 113 starts oscillating in the first lateral direction $x_1$ at the first ultrasonic frequency $f_1$ and forces the first bonding tool 111 and particularly the first tool tip 112 to also oscillate at the first oscillation frequency $f_1$ in the first lateral direction $x_1$. Thereby, energy is transferred into the interface region between the first and second bonding partners 301, 302, and a tight bond between the first and second bonding partners 301, 302 is formed. If the first and second bonding partners 301, 302 are electrically conductive, also an electrical connection between the first and second bonding partners 301, 302 may be formed.

In order to drive the first pressing device 114, the first control unit 110 may provide a first pressing device control signal $S_1(t)$ to the first pressing device 114 in order to cause the first pressing device 114 to provide a desired first pressing force $F_1$. That is, the first pressing force $F_1$ is generated by the first pressing device 114 based on the first pressing device control signal $S_1(t)$, applied to the first bonding tool 111, and transferred by the first bonding tool 111 to the first tool tip 112 which is spaced distant from the first ultrasonic transducer at a first distance $d_{111}$. The direction $z_1$ of the first pressing force $F_1$ (which may also be referred to as first pressing direction or as first vertical direction $z_1$) may be perpendicular or substantially perpendicular to the first lateral direction $x_1$. The first pressing force $F_1$ may be changed or, alternatively, kept constant during the bonding process. Alternatively or additionally, the first oscillation frequency $f_1$ may be changed or, alternatively, kept constant during the bonding process.

The first drive unit 100 serves to drive at least the first ultrasonic transducer 113 and, optionally, also the first pressing device 114. In order to drive the first ultrasonic transducer 113, the first control unit 110 may be designed to generate (e.g. to set and/or to regulate) the first electrical power $P_1(t)$ output by the first power supply 115 based on the first control signal $C_1$, and in order to control the first pressing device 114, the first control unit 110 may be designed to adjust (e.g. to set and/or to regulate) the pressing force $F_1$ produced by the first pressing device driver 118 and the first pressing device 114 downstream thereof.

Figure 2:
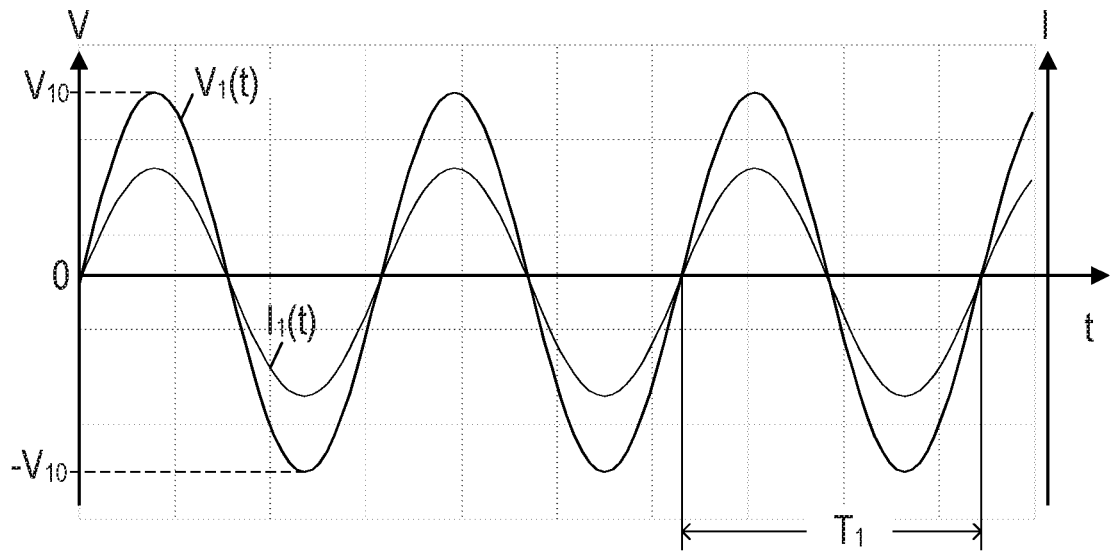
FIG. 2 illustrates a first transducer voltage and a first transducer current output by a power supply of the first bonding machine directly to an ultrasonic transducer of the first bonding machine.

The first electrical power $P_1(t)$ results from a first transducer voltage $V_1(t)$ and a first transducer current $I_1(t)$ both output by the first power supply 115 directly to the first ultrasonic transducer 113. Therefore, the first voltage $V_1(t)$ and the first current $I_1(t)$ may also be referred to as first transducer voltage $V_1(t)$ and first transducer current $I_1(t)$ respectively. That is, the first electrical power $P_1(t)$ may be calculated according to $P_1(t)=V_1(t)*I_1(t)$. FIG. 2 illustrates examples of the first transducer voltage $V_1(t)$ and the first transducer current $I_1(t)$. According to one example, the first voltage $V_1(t)$ may be controlled to have a desired signal shape (e.g. a sinusoidal shape or any other, for instance periodical, shape), and the first current $I_1(t)$ may automatically adjust dependent on the electrical properties of the first ultrasonic transducer 113.

Optionally, the first power supply 115 may include a first control loop 116, e.g. a phase locked loop (PLL), causing the first (alternating) current $I_1(t)$ to be in phase with the first (alternating) transducer voltage $V_1(t)$. Also optionally, the first control loop 116 may cause the first (alternating) transducer voltage $V_1(t)$ and the first (alternating) transducer current $I_1(t)$ to have their zero-crossings at identical or substantially identical instants of time so that (in the steady state, i.e. when the first oscillation period $T_1$, which is the reciprocal of the first ultrasonic frequency $f_1$, is constant) no or no substantial reactive power occurs.

As can be seen from an example of a sinusoidal first transducer voltage $V_1(t)$, the first electrical power $P_1(t)$ is, at least at the zero-crossings of the first transducer voltage $V_1(t)$, equal to zero. Hence, for a sinusoidal first transducer voltage $V_1(t)$ (or any other first transducer voltage $V_1(t)$ periodically assuming zero volts) the resulting first electrical power $P_1(t)$ periodically assumes zero at a high repetition frequency of at least twice the first ultrasonic frequency $f_1$. A person skilled in the art will appreciate that for a practical bonding process, in which a bonded connection between a first bonding partner 301 and a second bonding partner 302 is formed, an average first electrical power $<P_1>$ may be more informative than (permanently changing) instantaneous values of the first electrical power $P_1(t)$. On the other hand, it may be desirable to vary the average first electrical power $<P_1>$ during the bonding process. Therefore, considering an average first electrical power $<P_1>$ of the first electrical power $P_1(t)$ (in the description and the claims briefly also referred to as "average first electrical power $<P_1>$") may be useful. The average first electrical power $<P_1>=<P_1(V_1, I_1)>$ may be calculated as follows:

$$< P_1(V_1, I_1) > = \frac{1}{n_1 \cdot T_1} \cdot \int_{t_1}^{t_1 + n_1 \cdot T_1} V_1(t) \cdot I_1(t) dt \quad (1)$$

wherein t is the time, $n_1$ is a positive integer (i.e. $n_1 \geq 1$), ti is a point of time at which the averaging calculation starts, and $T_1$ is the first oscillation period (the reciprocal of the first ultrasonic frequency $f_1$, i.e. $T_1=1/f_1$.). For calculating an average first electrical power $<P_1>$, $n_1$ may be elected to have a low value. For example, $n_1$ may be, without being restricted to, elected from a range of 1 to 10 or 4 to 10. It should be noted that when forming a bonded connection between a second bonding partner 302 and a first bonding partner 301, the average first electrical power $<P_1>$ and the first ultrasonic frequency $f_1$ (and, therefore, the first oscillation period $T_1$) may change, during the related bonding process, over time. It should also be noted that the first transducer voltage $V_1(t)$ and the first transducer current $I_1(t)$ may be sinusoidal or not.

Figure 3:
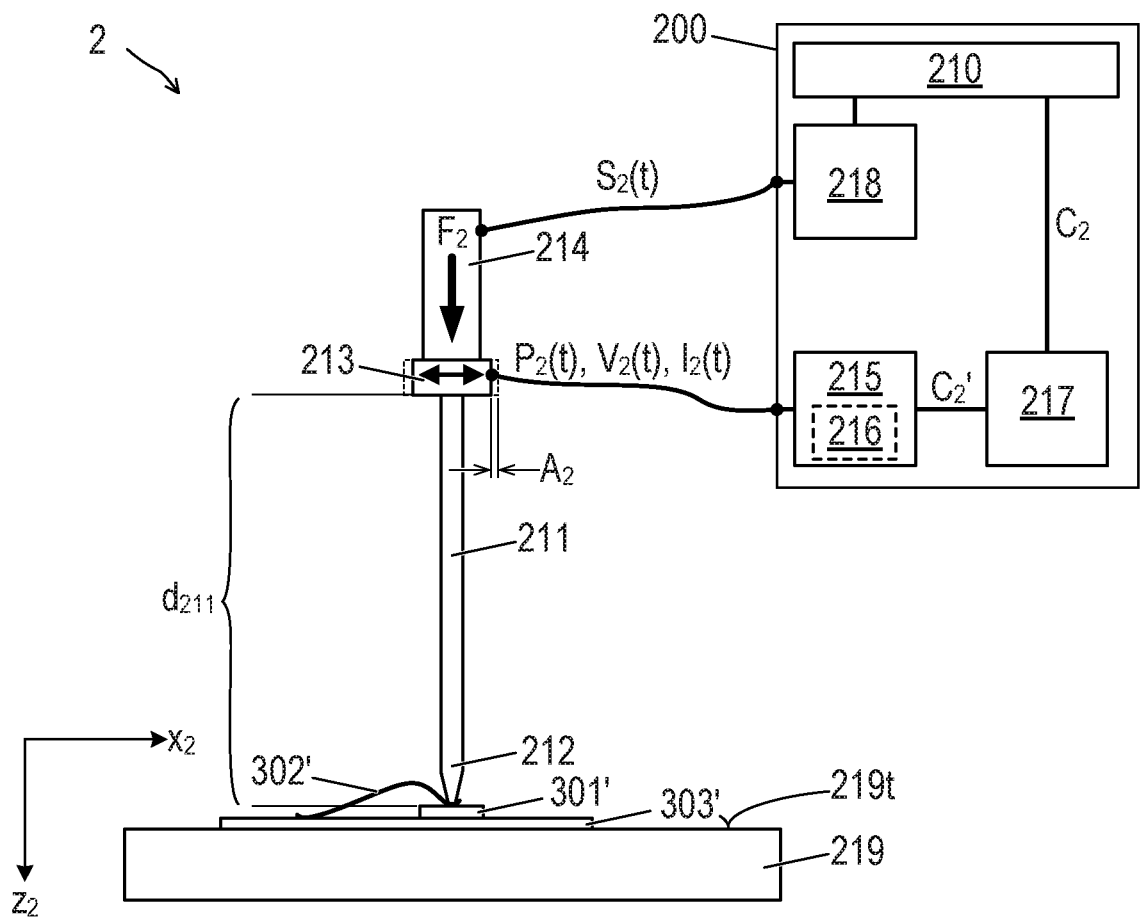
FIG. 3 illustrates a normal operation of a second bonding machine.

FIG. 3 schematically illustrates a second bonding machine 2 when forming a bonded connection between a first bonding partner 301' and a second bonding partner 302'. With regard to the bonded connection to be formed, the first bonding partner 301' as a whole or at least at its region to be bonded to the second bonding partner 302', may have the same properties as the first bonding partner 301 described with reference to FIG. 1 and the second bonding partner 302' as a whole or at least at its region to be bonded to the first bonding partner 301', may have the same properties as the second bonding partner 302 described with reference to FIG. 1. As used herein, "the same properties" may include "structurally identical", "of identical construction", "identical", "substantially identical", etc.

Except for the fact that the second power correction unit 217 is not omitted, the construction and the functional principle of the second bonding machine 2 may be the same as the construction and the functional principle of the first bonding machine 1 described with reference to FIG. 1. Therefore, the description of the construction and the functional principle of the first bonding machine 1 analogously applies for the second bonding machine 2. In order to differentiate between the elements (100, 111 . . . 119, 119t) of or related to the first bonding machine 1 and the elements (200, 211 . . . 219, 219t) of or related to the second bonding machine 2, a particular element of or related to the first bonding machine 1 is denoted as "first" element and identified using a three-digital reference numeral having a leading "1", and an element of or related to the second bonding machine 2 which corresponds to the particular element is denoted as "second" element and identified using the same reference numeral as the particular element but with the leading "1" replaced by a leading "2". That is, a first element of the first bonding machine 1 in FIG. 1 identified with a reference numeral 1xy corresponds to a second element of the second bonding machine 2 in FIG. 3 identified with a reference numeral 2xy. In other words, the description of the construction and the functional principle of the second bonding machine 2 may be derived from the description of the construction and the functional principle of the first bonding machine 1 by replacing each "first element 1xy" of or related to the first bonding machine 1 by a corresponding "second element 2xy" of or related to the second bonding machine 2. Further, the elements, signals, factors etc. related to the first bonding machine 1 are to be replaced by the corresponding elements, signals, factors etc. related to the second bonding machine 2 according to the following table:

| element, signal, factor etc. related to first bonding machine 1 | corresponding element, signal, factor etc. related to second bonding machine 2 |
| --- | --- |
| first pressing force $F_1$ | second pressing force $F_2$ |
| first lateral direction $x_1$ | second lateral direction $x_2$ |
| first vertical direction $z_1$ | second lateral direction $z_2$ |
| first pressing force control signal $S_1(t)$ | second pressing force control signal $S_2(t)$ |
| first control signal $C_1$ | second control signal $C_2$ |
| modified first control signal $C_1'$ | modified second control signal $C_2'$ |
| first oscillation amplitude $A_1$ | second oscillation amplitude $A_2$ |
| first oscillation period $T_1$ | second oscillation period $T_2$ |
| first ultrasonic frequency $f_1$ | second ultrasonic frequency $f_2$ |
| first distance $d_{111}$ | second distance $d_{211}$ |
| first electrical (transducer) voltage $V_1(t)$ | second electrical (transducer) voltage $V_2(t)$ |
| first electrical (transducer) current $I_1(t)$ | second electrical (transducer) current $I_2(t)$ |
| first electrical supply power $P_1(t)$ | second electrical supply power $P_2(t)$ |
| average first el. power $<P_1>$ | average second el. power $<P_2>$ |
| positive integer $n_1$ | positive integer $n_2$ |
| point of time $t_1$ | point of time $t_2$ |
| first bonding partner 301 | first bonding partner 301' |
| second bonding partner 302 | second bonding partner 302' |
| carrier 303 | carrier 303' |

Finally, equation (1) is to be replaced by equation (2):

$$< P_2(V_2, I_2) > = \frac{1}{n_2 \cdot T_2} \cdot \int_{t_2}^{t_2+n_2 \cdot T_2} V_2(t) \cdot I_2(t) dt. \quad (2)$$

Figure 4:
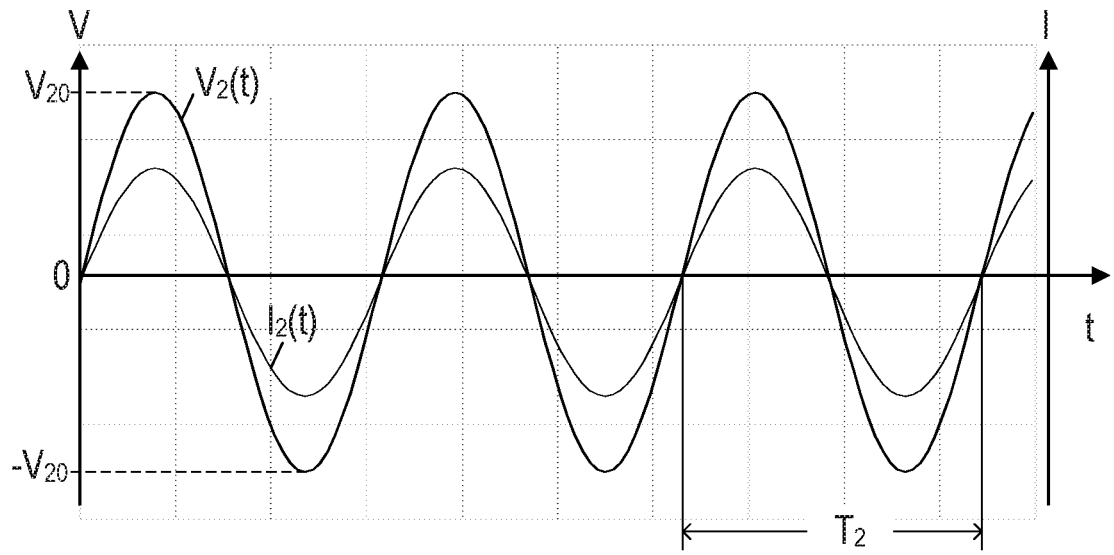
FIG. 4 illustrates a second transducer voltage and a second transducer current output by a power supply of the second bonding machine directly to an ultrasonic transducer of the second bonding machine.

The second electrical power $P_2(t)$ results from a second transducer voltage $V_2(t)$ and a second transducer current $I_2(t)$ both output by the second power supply 215 directly to the second ultrasonic transducer 213. Therefore, the second voltage $V_2(t)$ and the second current $I_2(t)$ may also be referred to as second transducer voltage $V_2(t)$ and second transducer current $I_2(t)$ respectively. That is, the second electrical power $P_2(t)$ may be calculated according to $P_2(t)=V_2(t) \cdot I_2(t)$. FIG. 4 illustrates examples of the second transducer voltage $V_2(t)$ and the second transducer current $I_2(t)$. According to one example, the second voltage $V_2(t)$ may be controlled to have (e.g. for each second ultrasonic frequency $f_1$) a desired signal shape (e.g. a sinusoidal shape or any other, for instance periodical, shape), and the second current $I_2(t)$ may automatically adjust dependent on the electrical properties of the second ultrasonic transducer 213.

As initially described, finding proper production parameters for a particular combination of a first type bonding partner and a second type bonding partner may require extensive experiments. In the examples of FIGS. 1 and 3, the first bonding partners 301, 301' represent "first type bonding partners" and the second bonding partners 302, 302' represent "second type bonding partners". It should be noted that any two first type bonding partners may have "the same properties" in a sense described above, and that any two second type bonding partners may have "the same properties" in a sense described above. Provided that proper production parameters for bonding a second type bonding partner 302 to a first type bonding partner 301 using the first bonding machine 1 have been found (typically requiring extensive experiments), it is desirable to transfer the found proper production parameters to the second bonding machine 2 when bonding the second type bonding partner 302' (i.e. a bonding partner of the same type as the second bonding partner 302 of FIG. 1) to a first type bonding partner 301' (i.e. to a bonding partner of the same type as the first bonding partner 301 of FIG. 1) using the second bonding machine 2.

At first glance, doing so appears to be easy, involving simply employing a second bonding machine 2 that is identical in construction to the first bonding machine 1 and driving the second ultrasonic transducer 213 and the second pressing device 214 with the second control unit 210 of the second bonding machine 2 using control signals (e.g. $V_2(t)$, $I_2(t)$, $S_2(t)$) which are identical to the corresponding control signals (e.g. $V_1(t)$, $I_1(t)$, $S_1(t)$) used by the first control unit 110 of the first bonding machine 1 for driving the first ultrasonic transducer 113 and the first pressing device 114. However, it turns out that this approach may still lead to an undesirably varying quality of the produced bond connections.

As found by the inventors of the present invention, the mentioned undesirably varying quality may be caused by a spread throughout assumedly identical first and second ultrasonic transducers 113, 213. That is, even when using a first control signal $C_1$ as the first power supply input signal of the first power supply 115 (i.e. when the first power correction unit 117 is omitted or when $C_1'=C_1$) and a second control signal $C_2$ identical to the first control signal $C_1$ as the second power supply input signal of the second power supply 215 (i.e. when the second power correction unit 217 would be omitted or when $C_2'=C_2$), the first and second ultrasonic transducers 113, 213 might behave noticeably different. Therefore, a simple method for calibrating the second bonding machine 2 based on a well-tested first bonding machine 1 would be desirable.

According to one aspect, a significant improvement as compared to the described unsatisfactory approach may be achieved by employing a second correction parameter $k_2$ that assists in employing the oscillation amplitude(s) of the first ultrasonic transducer 113 that has (have) been found to deliver a proper bonding result when bonding the first bonding partner 301 (i.e. a first type bonding partner) to the second bonding partner 302 (i.e. a second type bonding partner) using the first bonding machine 1 also as oscillation amplitude(s) of the second ultrasonic transducer 213 when bonding the first bonding partner 301' (i.e. a first type bonding partner) to the second bonding partner 302' (i.e. a second type bonding partner) using the second bonding machine 2. This is realized by calibrating the second bonding machine 2 based on a second correction parameter $k_2$ that is determined by comparing the operation of the first bonding machine 1 and the operation of the second bonding machine 2 under identical conditions. Therefore, the first bonding machine 1 may also be referred to as "master machine". In order to perform the calibration, the transducers 113, 213 are (mechanically) damped with the same damping (i.e. damped identically). In other words, the ultrasonic transducers 113, 213 are damped such that they experience the same mechanical damping. For instance, the ultrasonic transducers 113, 213 may be (mechanically) damped identically using the same damping device 400 or identically constructed damping devices 400. This will be explained in more detail further below.

Figure 5:
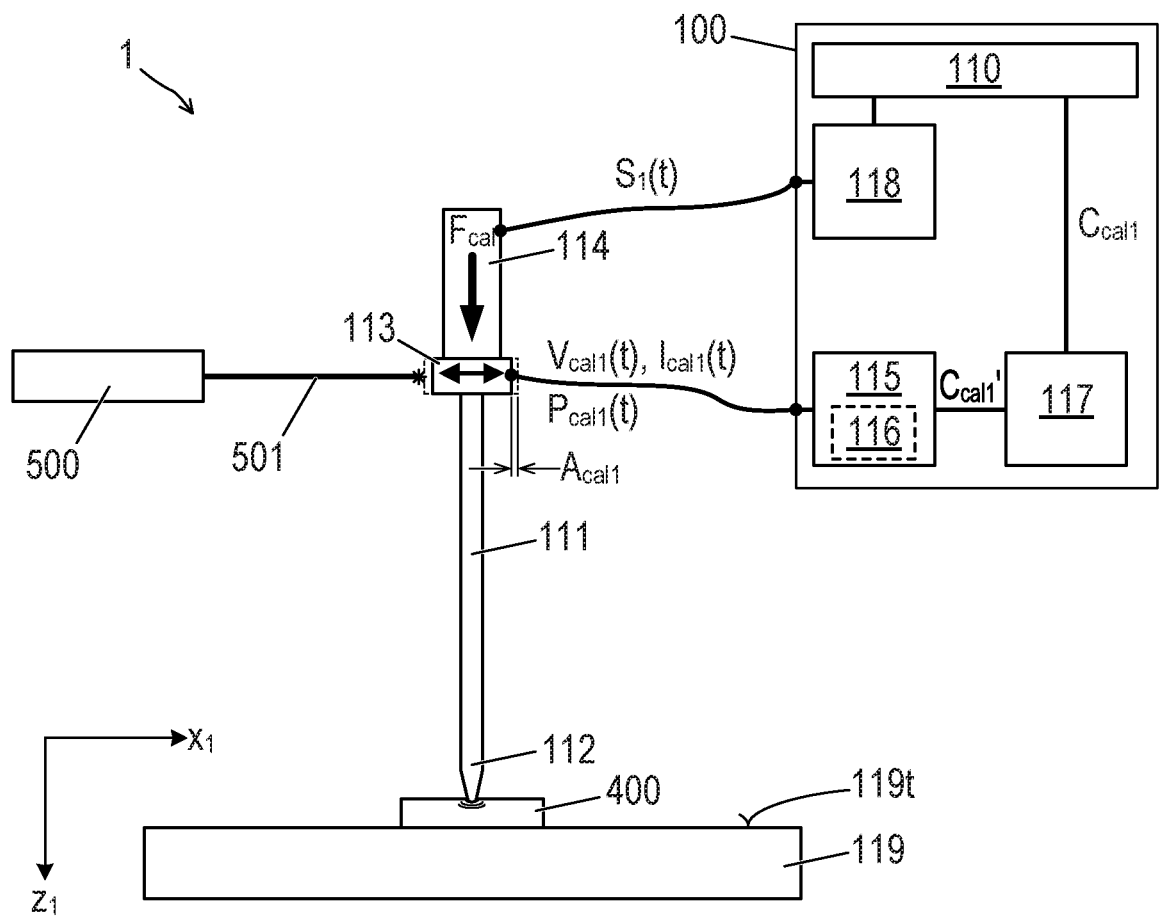
FIG. 5 illustrates a calibration operation of the first bonding machine of FIG. 1.

FIG. 5 illustrates the first bonding machine 1 of FIG. 1 operated in a calibration set-up in which the first ultrasonic transducer 113 it is damped by a first mechanical (calibration) damping. In the example of FIG. 5, a damping device 400 is disposed on the surface 119t of the first support 119. The first tool tip 112 is, via the first pressing device 114 and, e.g., controlled by the first control unit 110 or any other suitable control unit, pressed against the damping device 400 with a calibration force $F_{cal}$ (i.e. $F_1(t)=F_{cal}$). The calibration force $F_{cal}$ may be constant (e.g. be controlled by the first control unit 110 or any other suitable control unit to a predetermined value). Simultaneously, the first ultrasonic transducer 113 is, e.g. controlled by the first control unit 110 or any other suitable control unit, operated to oscillate in the first lateral direction $x_1$ at a first ultrasonic calibration frequency $f_{cal1}$. The first ultrasonic calibration frequency $f_{cal1}$ may be, without being restricted to, a frequency from 20 kHz to 120 kHz.

Operating the first ultrasonic transducer 113 to oscillate in the first lateral direction $x_1$ at the first ultrasonic calibration frequency $f_{cal1}$ may include that the first control unit 110 (or another suitable control unit) causes the first power supply 115 to provide a first electrical calibration power $P_{cal1}(t)$ as first electrical supply power $P_1(t)$, and, therefore, an average first electrical calibration power $<P_{cal1}(t)>$ as average first electrical supply power $<P_1(t)>$ directly to the first ultrasonic transducer 113. The first electrical calibration power $P_{cal1}(t)$ and, therefore, the average first electrical calibration power $<P_{cal1}>$ are generated based on a first calibration control signal $C_{cal1}$ which causes the first ultrasonic transducer 113, when it is damped by the first mechanical damping, to oscillate at a first calibration amplitude $A_{cal1}$. For this, the first calibration control signal $C_{cal1}$ may be directly provided to the first power supply 115 as first power supply input signal, e.g. when the first power correction unit 117 is omitted, or indirectly, e.g. via the first power correction unit 117 and a modified first calibration control signal $C_{cal1}'$ that is generated by the first power correction unit 117 based on the first calibration control signal $C_{cal1}$ and that is provided to the first power supply 115 as first power supply input signal.

Providing the first electrical calibration power $P_{cal1}(t)$ as first electrical supply power $P_1(t)$ directly to the first ultrasonic transducer 113 includes providing an (alternating) first electrical calibration voltage $V_{cal1}(t)$ and an (alternating) first electrical calibration current $I_{cal1}(t)$ directly to the first ultrasonic transducer 113 so that $P_1(t)=V_{cal1}(t) \cdot I_{cal1}(t)$. The average first electrical calibration power $<P_{cal1}(V_{cal1}(t) \cdot I_{cal1}(t))>$ (briefly also referred to as $<P_{cal1}>$) may be calculated according to equation (1) by $<P_{cal1}>=<P_1(V_{cal1}, I_{cal1})>$.

Figure 6:
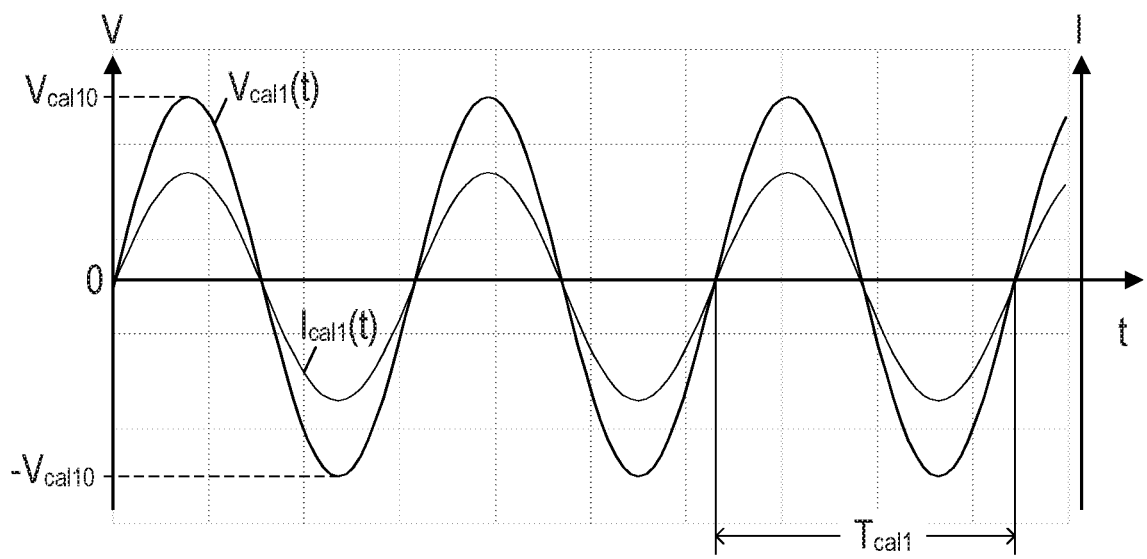
FIG. 6 illustrates a first calibration voltage directly applied to a first ultrasonic transducer of the first bonding machine of FIG. 1 and the resulting first alternating current.

FIG. 6 illustrates the first electrical calibration voltage $V_{cal1}(t)$ and the (alternating) first electrical calibration current $I_{cal1}(t)$ as functions of the time t. The period $T_1$ of the first electrical calibration voltage $V_{cal1}(t)$ and of the first electrical calibration current $I_{cal1}(t)$ is the reciprocal of the first ultrasonic calibration frequency $f_{cal1}$ (i.e. $T_1=1/f_{cal1}$). As already described above, the first power supply 115 may include a first control loop 116 (see FIGS. 1 and 5), e.g. a phase locked loop (PLL), causing the first alternating current $I_1(t)$ to be in phase with the first alternating voltage $V_1(t)$. Therefore, the first control loop 116 also causes the (alternating) first electrical calibration current $I_{cal1}(t)$ to be in phase with the (alternating) first electrical calibration voltage $V_{cal1}(t)$ which is illustrated in FIG. 6. As also mentioned above, the first control loop 116 may optionally cause the first (alternating) transducer voltage $V_1(t)$ and the first (alternating) transducer current $I_1(t)$ to have their zero-crossings at identical or substantially identical instants of time. Therefore, the first control loop 116 may optionally cause the first (alternating) electrical calibration voltage $V_{cal1}(t)$ and the first (alternating) calibration current $I_{cal1}(t)$ to have their zero-crossings at identical or substantially identical instants of time which is also illustrated in FIG. 6.

Figure 7:
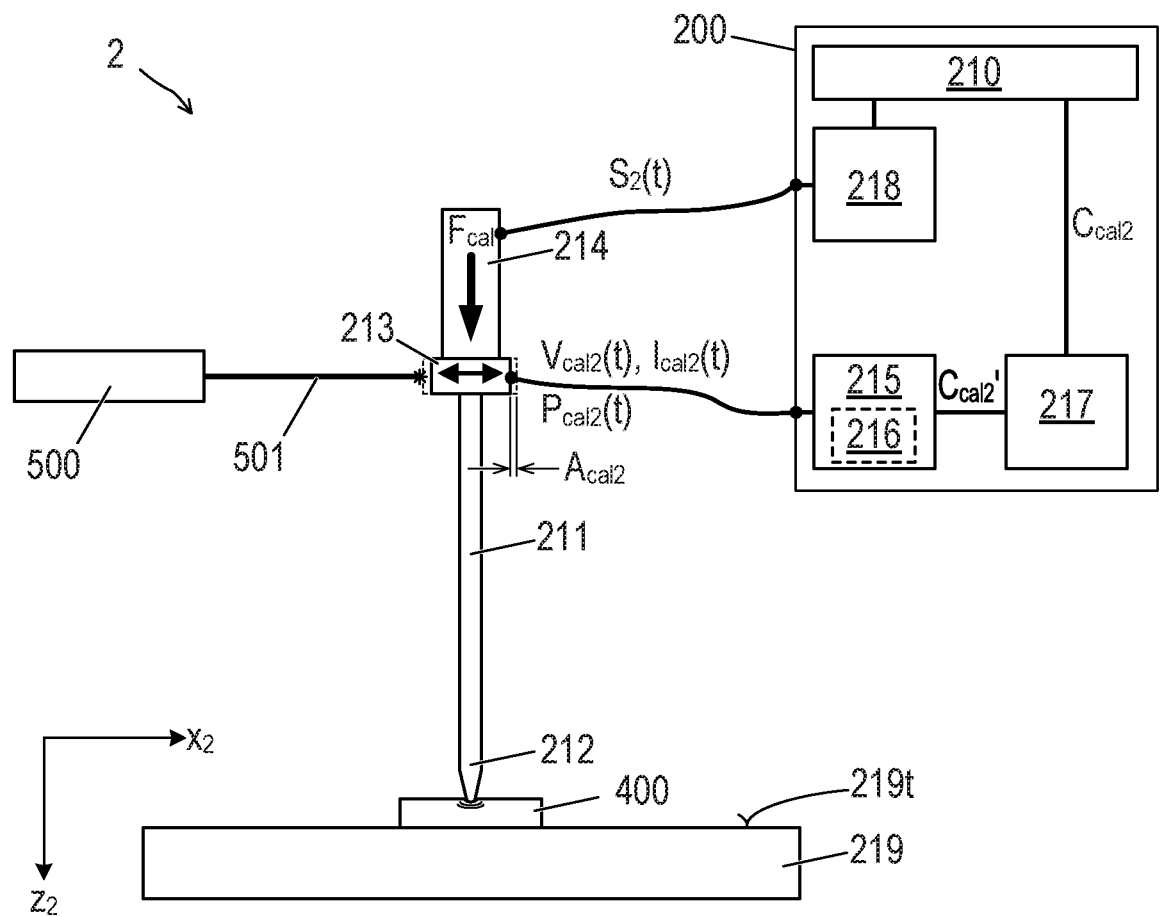
FIG. 7 illustrates a calibration operation of the second bonding machine of FIG. 3.

Analogously, the second bonding machine 2 of FIG. 3 may be, as illustrated in FIG. 7, operated in a calibration set-up in which the second ultrasonic transducer 213 is damped by a second mechanical (calibration) damping which is identical to the first mechanical (calibration) damping of the first ultrasonic transducer 113. In the example of FIG. 6, the damping device 400 used in the calibration setup of the first bonding machine 1 or an identically constructed damping device 400 is disposed on the surface 219t of the second support 219. The second tool tip 212 is, via the second pressing device 214 and, e.g., controlled by the second control unit 210 or any other suitable control unit, pressed against the damping device 400 with a calibration force $F_{cal}$ identical to the calibration force $F_{cal}$ used in the calibration setup of the first bonding machine 1 (i.e. $F_2(t)=F_{cal}$). Therefore, the calibration force $F_{cal}$ used in the calibration setup of the second bonding machine 2 may also be constant (e.g. be controlled by the second control unit 210 or any other suitable control unit to the predetermined value of $F_{cal}$). Simultaneously, the second ultrasonic transducer 213 is, e.g. controlled by the second control unit 210 or any other suitable control unit, operated to oscillate in a second lateral direction $x_2$ at a second ultrasonic calibration frequency $f_{cal2}$. The second ultrasonic calibration frequency $f_{cal2}$ may be, without being restricted to, a frequency from 20 kHz to 120 kHz. Optionally, the second ultrasonic calibration frequency $f_{cal2}$ may be identical to the first ultrasonic calibration frequency $f_{cal1}$.

Operating the second ultrasonic transducer 213 to oscillate in the second lateral direction $x_2$ at the second ultrasonic calibration frequency $f_{cal2}$ may include that the second control unit 210 (or another suitable control unit) causes the second power supply 215 to provide a second electrical calibration power $P_{cal2}(t)$ as second electrical supply power $P_2(t)$, and, therefore, an average second electrical calibration power $<P_{cal2}(t)>$ as average second electrical supply power $<P_2(t)>$ directly to the second ultrasonic transducer 213. The second electrical calibration power $P_{cal2}(t)$ and, therefore, the average second electrical calibration power $<P_{cal2}>$ are generated based on a second calibration control signal $C_{cal2}$ which causes the second ultrasonic transducer 213, when it is damped by the second mechanical damping, to oscillate at a second calibration amplitude $A_{cal2}$. For this, the second calibration control signal $C_{cal2}$ may be directly provided to the second power supply 215 as second power supply input signal, e.g. when the second power correction unit 217 is omitted, or indirectly, e.g. via the second power correction unit 217 and a modified second calibration control signal $C_{cal2}'$ that is generated by the second power correction unit 217 based on the second calibration control signal $C_{cal2}$ and that is provided to the second power supply 215 as second power supply input signal.

Providing the second electrical calibration power $P_{cal2}(t)$ as second electrical supply power $P_2(t)$ directly to the second ultrasonic transducer 213 includes providing an (alternating) second electrical calibration voltage $V_{cal2}(t)$ and an (alternating) second electrical calibration current $I_{cal2}(t)$ directly to the second ultrasonic transducer 213 so that $P_2(t)=V_{cal2}(t) \cdot I_{cal2}(t)$. The average second electrical calibration power $<P_{cal2}(V_{cal2}(t) \cdot I_{cal2}(t))>$ (briefly also referred to as $<P_{cal2}>$) may be calculated according to equation (2) by $<P_{cal2}>=<P_2(V_{cal2}(t), I_{cal2}(t))>$.

Figure 8:
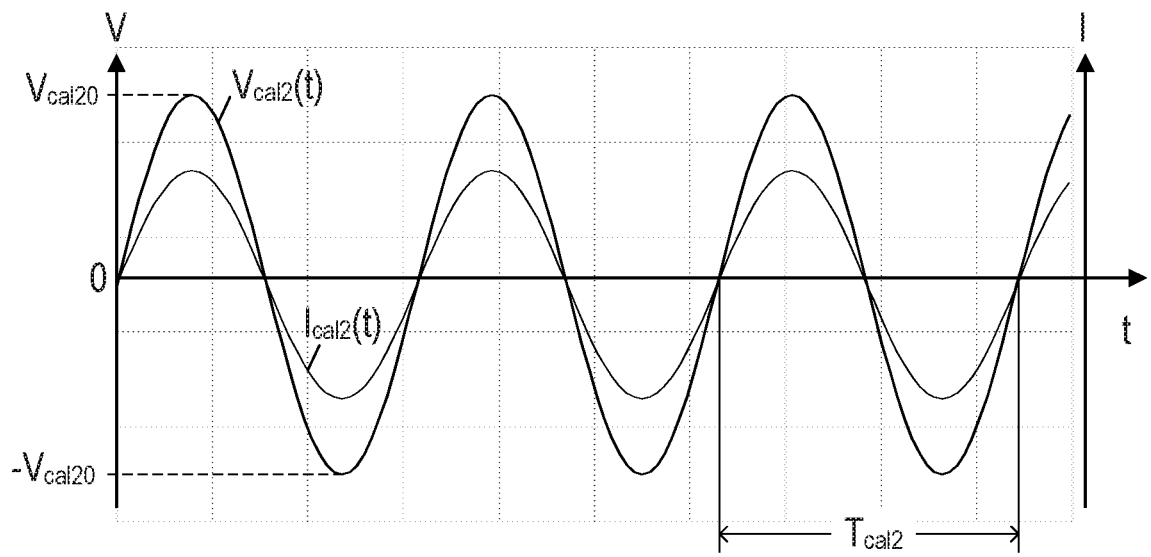
FIG. 8 illustrates a second calibration voltage directly applied to a second ultrasonic transducer of the second bonding machine of FIG. 3 and the resulting second alternating current.

FIG. 8 illustrates the second electrical calibration voltage $V_{cal2}(t)$ and the (alternating) second electrical calibration current $I_{cal2}(t)$ as functions of the time t. The period $T_{cal2}$ of the second electrical calibration voltage $V_{cal2}(t)$ and of the second electrical calibration current $I_{cal2}(t)$ is the reciprocal of the second ultrasonic calibration frequency $f_{cal2}$ (i.e. $T_{cal2}=1/f_{cal2}$). As already described above, the second power supply 215 may include a second control loop 216 (see FIGS. 3 and 6), e.g. a phase locked loop (PLL), causing the second alternating current $I_2(t)$ to be in phase with the second alternating voltage $V_2(t)$. Therefore, the second control loop 216 also causes the (alternating) second electrical calibration current $I_{cal2}(t)$ to be in phase with the (alternating) second electrical calibration voltage $V_{cal2}(t)$ which is illustrated in FIG. 8. As also mentioned above, the second control loop 216 may optionally cause the second (alternating) transducer voltage $V_2(t)$ and the second (alternating) transducer current $I_2(t)$ to have their zero-crossings at identical or substantially identical instants of time. Therefore, the second control loop 216 may optionally cause the second (alternating) electrical calibration voltage $V_{cal2}(t)$ and the second (alternating) calibration current $I_{cal2}(t)$ to have their zero-crossings at identical or substantially identical instants of time which is also illustrated in FIG. 8.

Calibrating the second bonding machine 2 based on the first bonding machine 1 may take place based on a comparative measurement in which both the first ultrasonic transducer 113 and the second ultrasonic transducer 213 are mechanically damped identically and oscillate in a steady state. A first electrical calibration supply signal having a first electrical parameter and powering the first ultrasonic transducer 113 to oscillate as described above at a first calibration amplitude $A_{cal1}$ is directly supplied to the first ultrasonic transducer 113, and a second electrical calibration supply having a second electrical parameter and powering the second ultrasonic transducer 213 to oscillate as described above at a second calibration amplitude $A_{cal2}$ is directly supplied to the second ultrasonic transducer 213. Thereby, the second electrical parameter is (e.g. by adjusting the second electrical calibration supply signal) adjusted such that the second calibration amplitude $A_{cal2}$ is identical to the first calibration amplitude $A_{cal1}$. The first and second electrical parameters are used to calibrate the second bonding machine 2 based on the first bonding machine 1. For this, the first electrical parameter and the second electrical parameter or a parameter or a function depending on and/or representing the first electrical parameter and the second electrical parameter may be stored in a memory of the second bonding machine 2, for instance in a memory of the second power correction unit 217. The stored first electrical parameter and the second electrical parameter or the stored parameter or function depending on and/or representing the first electrical parameter and the second electrical parameter may then be used to modify one, more than one or each second control signal $C_2$ based on the stored first and second electrical parameters, based on the stored parameter or based on the stored function.

The first and second electrical parameters may be selected to be signals of identical type. According to a first example, the first electrical parameter may represent an average first electrical power $<P_{cal1}>=<P_1(V_{cal1}(t), I_{cal1}(t))>$ according to equation (1) and the second electrical parameter may represent an average second electrical power $<P_{cal2}>=<P_2(V_{cal2}(t), I_{cal2}(t))>$ according to equation (2). According to a second example, the first electrical parameter may represent an amplitude $V_{cal10}$ (see FIG. 6) of the first electrical calibration voltage $V_{cal1}(t)$ and the second electrical parameter may represent an amplitude $V_{cal20}$ (see FIG. 8) of the second electrical calibration voltage $V_{cal2}(t)$. Thereby, the first and second electrical calibration voltages $V_{cal1}(t)$ and $V_{cal2}(t)$ may have the same basic form (e.g. a sinusoidal) so that $V_{cal2}(t)=C \cdot V_{cal1}(t+\Delta t_{12})$, wherein C is a constant and wherein $\Delta t_{12}$ is a constant that may also assume zero.

As used herein, a parameter q2 represents a parameter q1 when the parameter q1 can be derived from the parameter q2. For instance, the amplitude $V_{SIN0}$ of a sinusoidal voltage $V_{SIN}(t)$ can be calculated from the RMS (root mean square) value $V_{RMS}$ of the sinusoidal voltage $V_{SIN}(t)$ by $V_{SIN0}=V_{RMS}\cdot\sqrt{2}$. That is, the amplitude $V_{SIN0}$ can be derived from the RMS value $V_{RMS}$. Therefore, the RMS value $V_{RMS}$ represents the amplitude $V_{SIN0}$. Because the parameter q1 can be derived from q1 itself, also q1 is considered as "parameter representing q1".

A first example of a possible calibration process of the second bonding machine 2 based on the first bonding machine 1 will now be explained based on the above-mentioned example in which the first electrical parameter represents an average first electrical power $<P_{cal1}>=<P_1(V_{cal1}(t), I_{cal1}(t))>$ according to equation (1) and the second electrical parameter represents an average second electrical power $<P_{cal2}>=<P_2(V_{cal2}(t), I_{cal2}(t))>$ according to equation (2). As illustrated in FIGS. 6 and 8, $V_{cal1}(t)$ and $V_{cal2}(t)$ may be sinusoidal voltages.

The (alternating) first electrical calibration voltage $V_{cal1}(t)$ is directly applied to the first ultrasonic transducer 113 and causes an (alternating) first electrical calibration current $I_{cal1}(t)$, e.g. a sinusoidal current, through the first ultrasonic transducer 113. As a result, the first ultrasonic transducer 113 oscillates in the first lateral direction $x_1$ as described above. In the steady state, the first ultrasonic transducer 113 has, in the first lateral direction $x_1$, a first calibration amplitude $A_{cal1}$ (FIG. 5) and receives a first electrical calibration power $P_{cal1}(t)$ having an average first electrical calibration power $<P_{cal1}(t)>$. Analogously, the (alternating) second electrical calibration voltage $V_{cal2}(t)$ is directly applied to the second ultrasonic transducer 213 and causes an (alternating) second electrical calibration current $I_{cal2}(t)$, e.g. a sinusoidal current, through the second ultrasonic transducer 213. As a result, the second ultrasonic transducer 213 oscillates in the second lateral direction $x_2$ as described above. In the steady state, the second ultrasonic transducer 213 has, in the second lateral direction $x_2$, a second calibration amplitude $A_{cal2}$ (FIG. 7) and receives a second electrical calibration power $P_{cal2}(t)$ having an average second electrical calibration power $<P_{cal2}(t)>$. Thereby, the average second electrical calibration power $<P_{cal2}(t)>$ is adjusted such that the (steady-state) second calibration amplitude $A_{cal2}$ is identical to the (steady-state) first calibration amplitude $A_{cal1}$.

For instance, appropriately adjusting the average second electrical calibration power $<P_{cal2}(t)>$ may take place by adjusting (regulating) the amplitude $V_{cal20}$ (see FIG. 8) of the (e.g. sinusoidal) second electrical calibration voltage $V_{cal2}(t)$. Generally, methods for appropriately adjusting the average second electrical calibration power $<P_{cal2}(t)>$ are known in the art and thus not further explained herein.

A second example of a possible calibration process of the second bonding machine 2 based on the first bonding machine 1 will now be explained based on the above-mentioned example in which the first electrical parameter represents an amplitude $V_{cal10}$ (see FIG. 6) of the (e.g. sinusoidal) first electrical calibration voltage $V_{cal1}(t)$ and the second electrical parameter represents an amplitude $V_{cal}$ (see FIG. 8) of the (e.g. sinusoidal) second electrical calibration voltage $V_{cal2}(t)$.

The (alternating) first electrical calibration voltage $V_{cal1}(t)$ is directly applied to the first ultrasonic transducer 113 and causes an (alternating) first electrical calibration current $I_{cal1}(t)$, e.g. a sinusoidal current, through the first ultrasonic transducer 113. As a result, the first ultrasonic transducer 113 oscillates in the first lateral direction $x_1$ as described above. In the steady state, the first ultrasonic transducer 113 has, in the first lateral direction $x_1$, a first calibration amplitude $A_{cal1}$ (FIG. 5). Analogously, the (alternating) second electrical calibration voltage $V_{cal2}(t)$ is directly applied to the second ultrasonic transducer 213 and causes an (alternating) second electrical calibration current $I_{cal2}(t)$, e.g. a sinusoidal current, through the second ultrasonic transducer 213. As a result, the second ultrasonic transducer 213 oscillates in the second lateral direction $x_2$ as described above. In the steady state, the second ultrasonic transducer 213 has, in the second lateral direction $x_2$, a second calibration amplitude $A_{cal2}$ (FIG. 7). Thereby, the second electrical calibration voltage $V_{cal2}(t)$ is adjusted such that the (steady-state) second calibration amplitude $A_{cal2}$ is identical to the (steady-state) first calibration amplitude $A_{cal1}$.

For instance, appropriately adjusting the second electrical calibration voltage $V_{cal2}(t)$ may take place by adjusting (regulating) the amplitude $V_{cal20}$ (see FIG. 8) of the (e.g. sinusoidal) second electrical calibration voltage $V_{cal2}(t)$. Generally, methods for appropriately adjusting the second electrical calibration voltage $V_{cal2}(t)$ are known in the art and thus not further explained herein.

Summarizing the above, the knowledge resulting from the calibration process is that for a particular mechanical damping which is identical for the first and second ultrasonic transducers 113, 213, powering the first ultrasonic transducer 113 with the first electrical calibration power $P_{cal1}(t)$ and powering the second ultrasonic transducer 213 with the second electrical calibration power $P_{cal2}(t)$ leads to identical calibration amplitudes of the ultrasonic transducers 113, 213, i.e. $A_{cal1} = A_{cal2}$. The (approximative) calibration of the second bonding machine 2, in particular for second control signals $C_2$ that differ from the calibration control signal $C_{cal2}$, may take place based on the first and second electrical parameters of the first electrical calibration power $P_{cal1}(t)$ and second electrical calibration power $P_{cal2}(t)$, respectively.

Approximately calibrating the second bonding machine 2 may include adapting the second bonding machine 2 such that it modifies a second control signal $C_2$ based on a first electrical parameter of the first electrical calibration supply $P_{cal1}$ and on a second electrical parameter of the second electrical calibration supply $P_{cal2}$ in order to generate a modified second control signal $C_2'$, that it provides the modified second control signal $C_2'$ to the second power supply 215 in order to cause the second power supply 215 to generate a second electrical supply power $P_2(t)$, and that it provides the second electrical supply power $P_2(t)$ to the second ultrasonic transducer 213.

For one, more than one or each second control signal $C_2$, the calibrated second bonding machine 2 will generate a corresponding modified second control signal $C_2'$. Each modified second control signal $C_2'$ that is provided to the input of the second power supply 215 causes the second power supply 215 to output a second electrical supply power $P_2(t)$ to the second ultrasonic transducer 213. However, if the (unmodified) second control signal $C_2$ instead of the modified second control signal $C_2'$ was provided to the input of the second power supply 215, the (unmodified) second control signal $C_2$ would cause the second power supply 215 to output an unmodified second electrical supply power $P_{2unmod}(t)$ to the second ultrasonic transducer 213. In other words, feeding the modified second control signal $C_2'$ instead of the (unmodified) second control signal $C_2$ to the input of the second power supply 215 causes the second power supply 215 to output a corresponding (modified) second electrical supply power $P_2(t)$ instead of the (unmodified) second electrical supply power $P_{2unmod}(t)$ to the second ultrasonic transducer 213. Therefore, to each second control signal $C_2$, a corresponding modified second control signal $C_2'$, a corresponding (unmodified) second electrical supply power $P_{2unmod}(t)$ and a corresponding (modified) second electrical supply power $P_2(t)$ are assigned.

According to one embodiment, adapting the second bonding machine 2 such that it modifies the second control signal $C_2$ based on the first electrical parameter of the first electrical calibration supply $P_{cal1}$ and on the second electrical parameter of the second electrical calibration supply $P_{cal2}$ in order to generate the modified second control signal $C_2'$ may take place by adapting the second bonding machine 2 such that it modifies the second control signal $C_2$ based on a difference $\Delta$ between the first electrical parameter of the first electrical calibration supply $P_{cal1}$ and the second electrical parameter of the second electrical calibration supply $P_{cal2}$ in order to generate the modified second control signal $C_2'$.

For instance, the second bonding machine 2 may be adapted to generate the modified second control signal $C_2'$ such that a difference $\Delta$ between an electrical parameter of the unmodified second electrical supply power $P_{2unmod}(t)$ and an electrical parameter of the second electrical supply power $P_2(t)$ is equal to the difference $\Delta$ between the first electrical parameter of the first electrical calibration supply $P_{cal1}$ and the second electrical parameter of the second electrical calibration supply $P_{cal2}$. Thereby, the electrical parameter of the unmodified second electrical supply power $P_{2unmod}(t)$, the electrical parameter of the second electrical supply power $P_2(t)$, the first electrical parameter of the first electrical calibration supply $P_{cal1}$ and the second electrical parameter of the second electrical calibration supply $P_{cal2}$ may be of the same parameter type, e.g. an average power or an average voltage or a voltage amplitude or another parameter type.

For instance, if the parameter type is an average power, the electrical parameter of the unmodified second electrical supply power $P_{2unmod}(t)$, the electrical parameter of the second electrical supply power $P_2(t)$, the first electrical parameter of the first electrical calibration supply $P_{cal1}$ and the second electrical parameter of the second electrical calibration supply $P_{cal2}$ are average powers of $P_{2unmod}(t)$, $P_2(t)$, $P_{cal1}$ and $P_{cal2}$, respectively. Or, if the parameter type is a voltage amplitude, the electrical parameter of the unmodified second electrical supply power $P_{2unmod}(t)$, the electrical parameter of the second electrical supply power $P_2(t)$, the first electrical parameter of the first electrical calibration supply $P_{cal1}$ and the second electrical parameter of the second electrical calibration supply $P_{cal2}$ are voltage amplitudes of the voltages generating, together with the related currents, the electrical powers $P_{2unmod}(t)$, $P_2(t)$, $P_{cal1}$ and $P_{cal2}$, respectively. Or, if the parameter type is an average voltage, the electrical parameter of the unmodified second electrical supply power $P_{2unmod}(t)$, the electrical parameter of the second electrical supply power $P_2(t)$, the first electrical parameter of the first electrical calibration supply $P_{cal1}$ and the second electrical parameter of the second electrical calibration supply $P_{cal2}$ are average voltages of the voltages generating, together with the related currents, the electrical powers $P_{2unmod}(t)$, $P_2(t)$, $P_{cal1}$ and $P_{cal2}$, respectively.

Using a voltage amplitude or an average voltage as parameter type is of particular interest if each of the electrical powers $P_{2unmod}(t)$, $P_2(t)$, $P_{cal1}$ and $P_{cal2}$ is generated by an alternating voltage and an alternating current which are proportional to one another (so that they are in phase, have their zero crossings at identical instants of time and a constant, real-valued impedance of the respective first or second ultrasonic transducer 113, 213 as proportionality factor).

According to one example, the second bonding machine 2 may be adapted to generate for a number or for each of different second control signals $C_2$ a corresponding modified second control signal $C_2'$ such that for each of the second control signals $C_2$ and the corresponding modified second control signal $C_2'$ a difference $\Delta$ between an electrical parameter of the corresponding unmodified second electrical supply power $P_{2unmod}(t)$ and an electrical parameter of the second electrical supply power $P_2(t)$ is the same and equal to the difference $\Delta$ between the first electrical parameter of the first electrical calibration supply $P_{cal1}$ and the second electrical parameter of the second electrical calibration supply $P_{cal2}$.

For instance, it is assumed that there is a number of pairwise distinct first control signals $C_{1X}$ (X=A, B, C, ... ) each of which causing, when used as first control signal $C_1$ (i.e. $C_1 = C_{1X}$, see FIG. 1), a corresponding first amplitude $A_1 = A_{1X}$ of the first ultrasonic transducer 113. For example, the first control signals $C_{1X}$ may be provided by the first control unit 110 of the first bonding machine 1. The first control signals $C_{1X}$ may also be provided to the first bonding machine 1 as external input signals. In order to define a desired bonding profile, each of these first control signals $C_{1X}$ may be, e.g. subsequently and directly provided to the input of the first power supply 115 and cause the first power supply 115 to output a corresponding electrical power to the first ultrasonic transducer 113. In turn, the corresponding electrical power output to the first ultrasonic transducer 113 may cause the first ultrasonic transducer 113 to oscillate at a corresponding first amplitude $A_1=A_{1X}$ (X=A, B, C, ...).

Apparently, it is advantageous if the same pairwise distinct first control signals $C_{1X}$ (X=A, B, C, ...) cause, when used as second control signals $C_{2X}$ (X=A, B, C, ...) for the second bonding machine 2 (i.e. $C_2=C_{2X}$, see FIG. 3), corresponding second amplitudes $A_2=A_{2X}$ (X=A, B, C, ...) of the second ultrasonic transducer 213 which are substantially identical to the corresponding first amplitudes $A_{1X}$. In other words, even though the first and second ultrasonic transducers 113, 213 may behave differently, it may be desired to approximately calibrate the second bonding machine 2 such that each first control signal $C_{1X}$ causing a corresponding first amplitude $A_{1X}$ of the first ultrasonic transducer 113 causes, when used as second control signal $C_{2X}$, a corresponding second amplitude $A_{2X}$ of the second ultrasonic transducer 213 which is identical or approximately identical to $A_{1X}$ (i.e. $C_{2X}=C_{1X}$ causes $A_{2X}$ to be identical or approximately identical to $A_{1X}$; X=A, B, C, ...).

Figure 9:
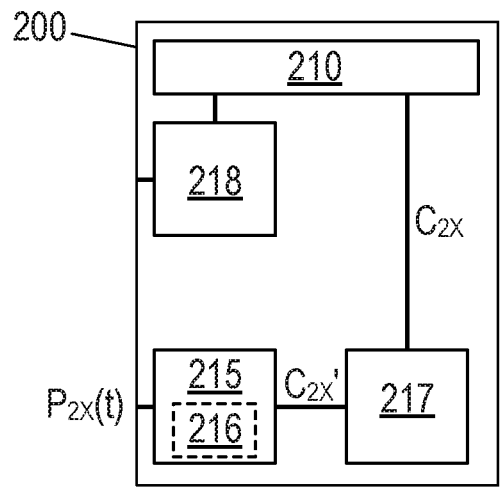
FIG. 9(a) illustrates the behavior of the calibrated second bonding machine of FIG. 3 when a modified second control signal is provided to the input of the power supply of the ultrasonic transducer of the second bonding machine.
FIG. 9(b) illustrates the behavior of the second bonding machine of FIG. 3 when the unmodified second control signal instead of the modified second control signal is provided to the input of the power supply of the ultrasonic transducer of the second bonding machine.
Figure 9:
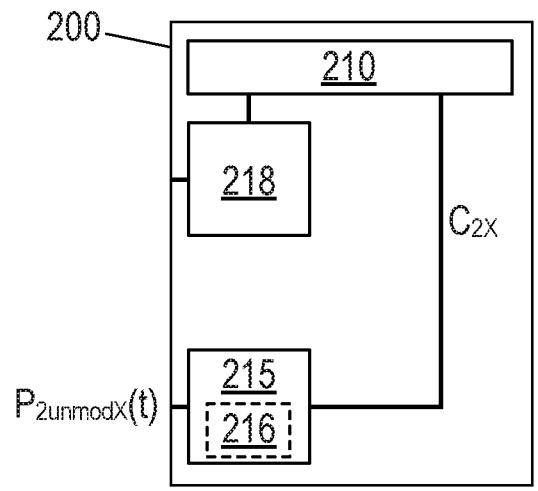

The related calibration process will now be explained in more detail with reference to FIG. 9. According to FIG. 9(a), each of the second control signals $C_{2X}$ (X=A, B, C, ...) is provided to and modified by the second power correction unit 217 in order to obtain a corresponding modified second control signal $C_{2X}{'}$ (X=A, B, C, ...) which when provided to the input of the second power supply 215 causes the second power supply 215 to output a corresponding second power signal $P_{2X}(t)$ to the second ultrasonic transducer 213. In turn, each second power signal $P_{2X}(t)$ causes the second ultrasonic transducer 213 to oscillate at a corresponding second amplitude $A_{2X}$. In FIG. 9(b) it is illustrated that the unmodified second control signals $C_{2X}$ (X=A, B, C, ...) would, when provided to the input of the second power supply 215, cause the second power supply 215 to output corresponding unmodified second power signals $P_{2unmodX}(t)$ to the second ultrasonic transducer 213.

As described above, a difference $\Delta$ between the first electrical parameter of the first electrical calibration supply $P_{cal1}$ and the second electrical parameter of the second electrical calibration supply $P_{cal2}$ may have been identified. This same difference $\Delta$ is used to modify each of the second control signals $C_{2X}$ (X=A, B, C, ...) by the second power correction unit 217 (FIG. 9(a)) such that the difference $\Delta$ between an electrical parameter of the unmodified second electrical supply power $P_{2unmodX}(t)$ and an electrical parameter of the second electrical supply power $P_{2X}(t)$ is equal to the difference $\Delta$. Thereby, the electrical parameter of the unmodified second electrical supply power $P_{2unmodX}(t)$, the electrical parameter of the second electrical supply power $P_{2X}(t)$, the first electrical parameter of the first electrical calibration supply $P_{cal1}$ and the second electrical parameter of the second electrical calibration supply $P_{cal2}$ may be of the same parameter type, e.g. an average power or an average voltage or a voltage amplitude or another parameter type.

The second electrical supply power $P_{2X}(t)$ is a product of a corresponding second electrical supply voltage $V_{2X}(t)$ and a corresponding second electrical supply current $I_{2X}(t)$, i.e. $P_{2X}(t)=V_{2X}(t) \cdot I_{2X}(t)$ (X=A, B, C, ...). Accordingly, the unmodified second electrical supply power $P_{2unmodX}(t)$ is a product of a corresponding unmodified second electrical supply voltage $V_{2unmodX}(t)$ and a corresponding unmodified second electrical supply current $I_{2unmodX}(t)$, i.e. $P_{2unmodX}(t)=V_{2unmodX}(t) \cdot I_{2unmodX}(t)$ (X=A, B, C, ...).

If the parameter type is an average power, the second control signals $C_{2X}$ may be modified to corresponding modified second control signals $C_{2X}{'}$ such that $<P_{2unmodX}(t)>-<P_{2X}(t)>=<P_{cal1}(t)>-<P_{cal2}(t)>=\Delta=$ constant (X=A, B, C, ...). For instance, the average powers may be calculated according to equations (1) and (2).

If the parameter type is an voltage amplitude, the second control signals $C_{2X}$ may be modified to corresponding modified second control signals $C_{2X}{'}$ such that $V_{2unmodX0}-V_{2X0}=V_{cal10}-V_{cal20}=\Delta=$ constant, wherein $V_{2unmodX0}$ is the voltage amplitude of $V_{2unmodA}(t)$ and $V_{2X0}$ is the voltage amplitude of $V_{2X}(t)$ (X=A, B, C, ...).

If the parameter type is an average voltage, the second control signals $C_{2X}$ may be modified to corresponding modified second control signals $C_{2X}$ such that $<V_{2unmodX}(t)>-<V_{2X}(t)>=<V_{cal1}(t)>-<V_{cal2}(t)>=\Delta=$ constant (X=A, B, C, ...). The average voltages may—exactly or approximately—be determined using any averaging method. For instance, a voltage to be averaged may pass through a low pass filter that outputs the averaged voltage. Alternatively or additionally, a voltage V(t) to be averaged may be calculated based on a known shape (e.g. sinusoidal shape) and a known amplitude, e.g. by $$<V(t)> = \frac{1}{n_3 \cdot T_3} \cdot \int_{t_3}^{t_3+n_3 \cdot T_3} \cdot V(t) dt \qquad (3)$$

wherein t is the time, $n_3$ is a positive integer (i.e. $n_3 \geq 1$), $t_3$ is a point of time at which the averaging calculation starts, and $T_3$ is an oscillation period of the voltage V(t) to be averaged. The parameter $n_3$ may be elected to have a low value. For example, $n_3$ may be, without being restricted to, elected from a range of 1 to 10 or 4 to 10.

In the calibration process described above, the ultrasonic transducers 113, 213 are (mechanically) damped identically using the same damping device 400 or identically constructed damping devices 400.

According to a first example, a damping device 400 may be an elastic pad having, at a temperature of 23° C., a shore-hardness of more than 60 shore A (which approximately corresponds to 16 shore D), e.g. of more than 60 shore A and less than 100 shore A (which approximately corresponds to 58 shore D). Suitable materials are, without being restricted to, e.g., ethylene propylene diene monomer (EPDM) rubber, or a cellular material, e.g. nitrile butadiene rubber (NBR).

According to a second example, a damping device 400 may be a semiconductor chip and the pressing force $F_{cal}$ may be greater than zero.

Figure 10:
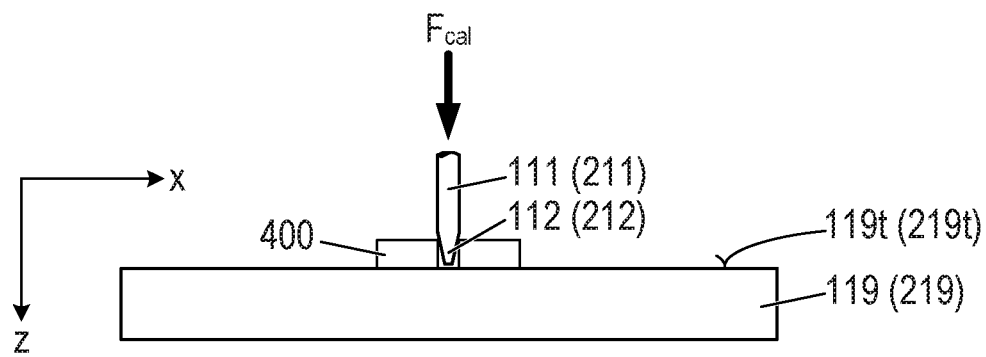
FIG. 10 illustrates an example in which an oscillating ultrasonic transducer mechanically coupled to a bonding tool is indirectly damped using a clamp clamping a tool tip of the bonding tool.

According to a third example illustrated in FIG. 10, a damping device 400 may be a damping clamp clamping the respective tool tip 112, 212. The pressing force $F_{cal}$ may be zero, or greater than zero.

Figure 11:
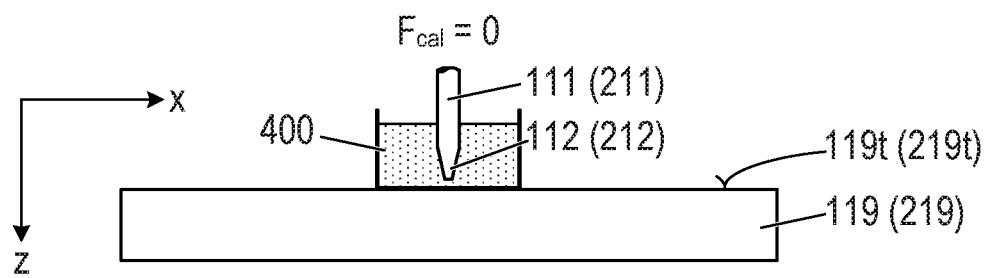
FIG. 11 illustrates an example in which an oscillating ultrasonic transducer mechanically coupled to a bonding tool is indirectly damped by immersing a tool tip of the bonding tool into a fluid.

According to a fourth example illustrated in FIG. 11, a damping device 400 may be a fluid (e.g. a liquid) into which the respective tool tip 112, 212 is immersed and the pressing force $F_{cal}$ is zero (i.e. there is no pressing force).

Figure 12:
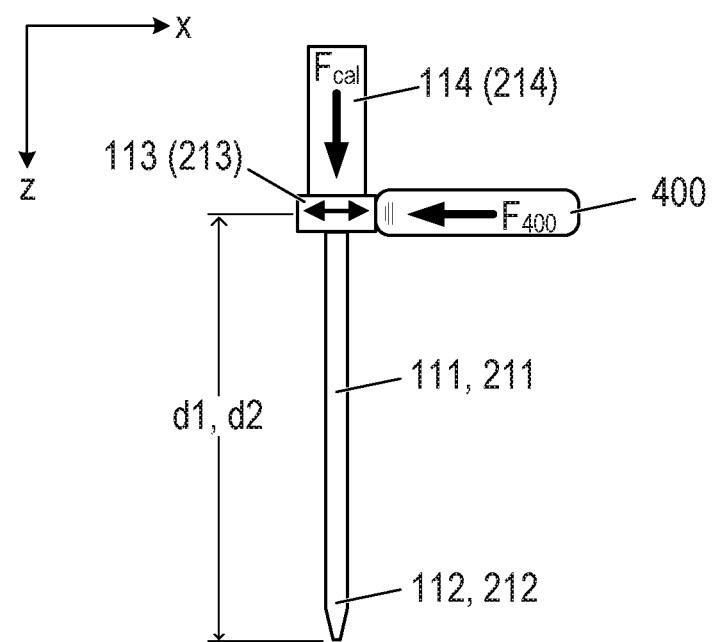
FIG. 12 illustrates an example in which an oscillating ultrasonic transducer mechanically coupled to a bonding tool is directly damped using an elastic pad affecting the transducer.

According to a fifth example illustrated in FIG. 12, a damping device 400 may directly act upon the transducer 113, 213, and the pressing force $F_{cal}$ may be zero or greater than zero. For instance, the damping device 400 may be an elastic pad that physically contacts the transducer 113, 213 and that may have, e.g., material properties mentioned with respect the first example. Alternatively, the damping device 400 may directly contact the bonding tool 111, 211 to which the transducer 113, 213 is mechanically coupled in a region close to the transducer 113, 213 but distant from the respective tool tip 112, 212. That is, the damping device 400 may directly contact the bonding tool 111, 211 at a (center) distance from the respective tool tip 112, 212 that is equal to the (center) distance d1, d2 between the respective transducer 113, 213 and the tool tip 112, 212 of the respective bonding tool 111, 211. In each of the mentioned alternatives, the damping device 400 may be, distant from the respective tool tip 112, 212 and close to the respective transducer 113, 213, pressed against the unit formed by the respective transducer 113, 213 and the respective bonding tool 111, 211 at a damping force $F_{400}$ parallel to the lateral direction x (i.e. the direction of the oscillation of the transducer 113, 213).

In each of the above examples, at least one of the first calibration amplitude $A_{cal}$ of the first ultrasonic transducer 113 of the first bonding machine 1 and the second calibration amplitude $A_{cal2}$ of the second ultrasonic transducer 213 of the second bonding machine 2 may be determined by laser vibrometry. For instance, a laser system 500 may be employed to determine the first calibration amplitude $A_{cal1}$ of the first ultrasonic transducer 113 of the first bonding machine 1 using a laser beam 501 (see FIG. 5). Accordingly, the same or a different laser system 500 may be employed to determine the second calibration amplitude $A_{cal2}$ of the second ultrasonic transducer 213 of the second bonding machine 2 using a laser beam 501 (see FIG. 7). As illustrated in FIGS. 5 and 7, the first and second calibration amplitudes $A_{cal1}$, $A_{cal2}$ may be determined directly at the respective ultrasonic transducer 113, 213 (i.e. the laser beam 501 is incident on the respective ultrasonic transducer 113, 213), or indirectly (e.g. when the laser beam 501 is incident on a point distant from the tool tip 112, 212 to which the respective ultrasonic transducer 113, 213 is mechanically coupled and close to the respective transducer 113, 213, on the bonding tool 111, 211.

Figure 13:
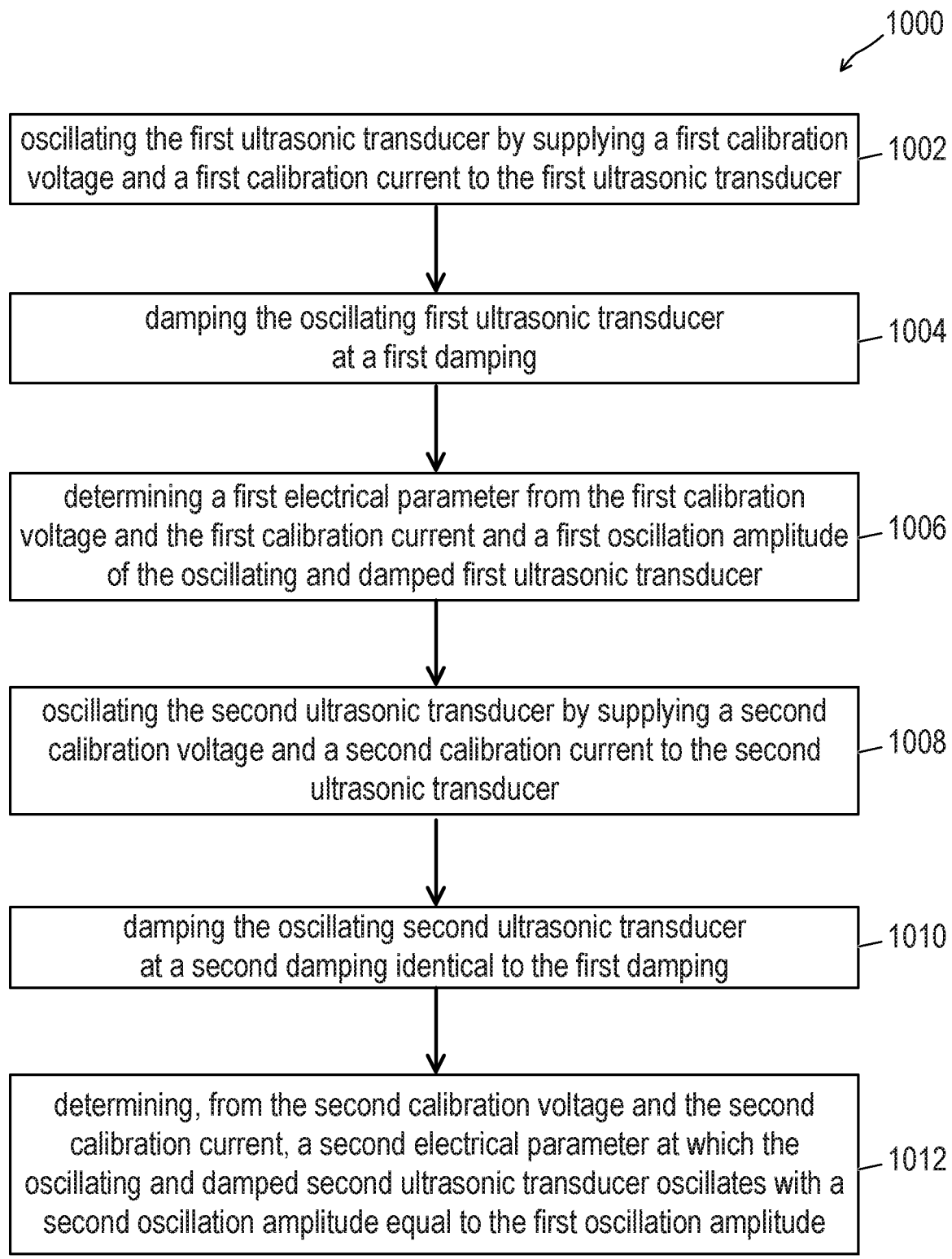
FIG. 13 illustrates a partial method for calibrating a second bonding machine based on a calibrated first bonding machine.

FIG. 13 illustrates, based on the examples explained above, a partial method 1000 for calibrating a second bonding machine 2 based on a calibrated first bonding machine 1. In that method 1000, the first ultrasonic transducer 113 is oscillated by supplying a first electrical calibration voltage $V_{cal1}(t)$ and a first electrical calibration current $I_{cal1}(t)$ to the first ultrasonic transducer 113 (1002). The oscillating first ultrasonic transducer 113 is damped at a first damping (1004). A first electrical parameter is determined from the first calibration voltage $V_{cal1}(t)$ and the first calibration current $I_{cal1}(t)$, and a first oscillation amplitude $A_{cal1}$ of the oscillating and damped first ultrasonic transducer 113 is determined (1006). The second ultrasonic transducer 213 is oscillated by supplying a second calibration voltage $V_{cal2}(t)$ and a second calibration current $I_{cal2}(t)$ to the second ultrasonic transducer 213 (1008). The oscillating second ultrasonic transducer 213 is damped at a second damping identical to the first damping (1010). From the second calibration voltage $V_{cal2}(t)$ and the second calibration current $I_{cal2}(t)$, a second electrical parameter at which the oscillating and damped second ultrasonic transducer 213 oscillates with a second oscillation amplitude $A_{cal2}$ equal to the first oscillation amplitude $A_{cal1}$, is determined (1012). Thereby, the first electrical parameter and the second electrical parameter may be of the same parameter type, e.g. an average power or an average voltage or a voltage amplitude or another parameter type.

Figure 14:
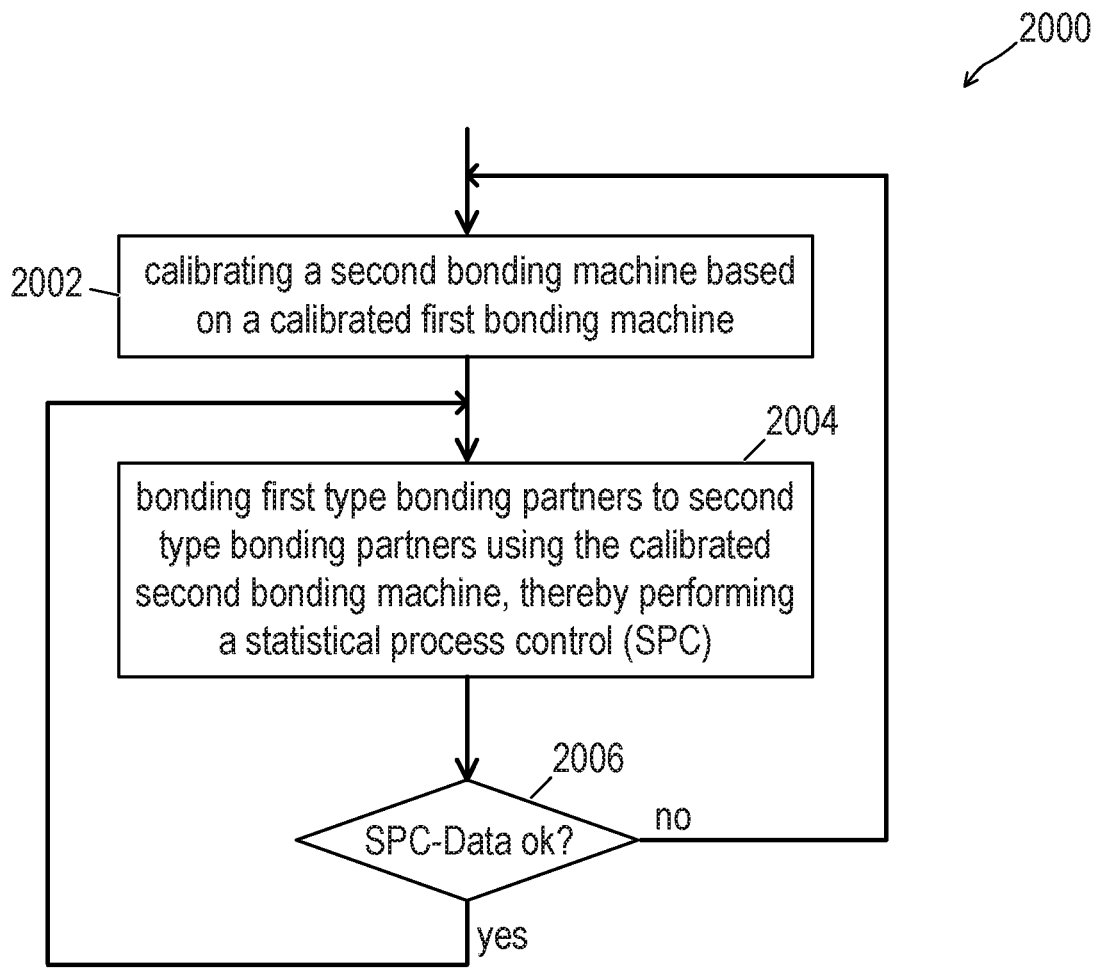
FIG. 14 illustrates a method for bonding first type bonding partners to second type bonding partners using statistical process control

Referring to FIG. 14, a method 2000 for bonding first type bonding partners 301' to second type bonding partners 302' using the calibrated second bonding machine 2 will be explained. Initially, a second bonding machine 2 is calibrated based on a calibrated first bonding machine 1 (2002). The calibration may be performed as described above.

Subsequently, first type bonding partners 301' are bonded to second type bonding partners 302' using the calibrated second bonding machine 2. Thereby, a statistical process control (SPC) may be performed (2004). If the SPC-Data are ok (i.e. the bonding results are acceptable), there is no need for recalibrating the second bonding machine 2, and the process of bonding first type bonding partners 301' to second type bonding partners 302' using the calibrated second bonding machine 2 may go on (2006, "YES"). However, if the SPC-Data are not ok (i.e. the bonding results are inacceptable or are acceptable but expected to become inacceptable) (2006, "NO"), the second bonding machine 2 will be (re)calibrated based on the or another calibrated first bonding machine 1 (2002) and the described process may be repeated, and so on.

In the above-explained methods and modifications, the first and second bonding partners have been described as constituent parts for forming electronic circuits. Nevertheless, the disclosed principles also apply for any other first and second bonding partners.

In the examples described above, the components of the first drive unit 100 (e.g. the first control unit 110, the first power supply 115, the first power correction unit 117 and the first pressing device driver 118) have been described as individual constituents. However, any two or more of the components of the first drive unit 100 may be combined to form a single unit. Further, at least some of the components of the first drive unit 100 may be, at least in part, implemented in software. The same analogously applies for the components of the second drive unit 200. Moreover, all averages of signals (e.g. the first electrical power, the second electrical power, etc.) have been, for the sake of clearness, described as being calculated by averaging the respective signal over one or more complete oscillation period (e.g. $T_1$, $T_2$) of the respective signal. However, each of these averages may be determined by any method known in the art. Thereby, the average of the respective signal is not required to be formed based on one or more complete oscillation period (e.g. $T_1$, $T_2$) of the respective signal. For instance, the average value of a signal may be a moving average. For instance, such a moving average may be derived by low-pass filtering the respective signal. It is also possible, to sample a signal to be averaged at predetermined instants of time and calculate the average value based on the acquired sample values.

The invention claimed is:

1. A method for calibrating a second bonding machine based on a calibrated first bonding machine, the first bonding machine comprising a first ultrasonic transducer, the second bonding machine comprising a second ultrasonic transducer and a power supply, the method comprising:

damping the first ultrasonic transducer by a first mechanical damping;

providing a first electrical calibration supply to the first ultrasonic transducer, the first electrical calibration supply causing the first ultrasonic transducer, when it is damped by the first mechanical damping, to oscillate at a first calibration amplitude;

providing a second electrical calibration supply to the second ultrasonic transducer, wherein the second electrical calibration supply is configured to cause the second ultrasonic transducer, when it is damped by a second mechanical damping identical to the first mechanical damping, to oscillate at a second calibration amplitude identical to the first calibration amplitude; and adapting the second bonding machine to:
modify a second control signal based on a first electrical parameter of the first electrical calibration supply and on a second electrical parameter of the second electrical calibration supply in order to generate a modified second control signal;
provide the modified second control signal to the power supply in order to cause the power supply to generate a second electrical supply; and
provide the second electrical supply to the second ultrasonic transducer.

2. The method of claim 1, wherein:
the first electrical parameter is an average of an electrical power of the first electrical calibration supply and the second electrical parameter is an average of an electrical power of the second electrical calibration supply; or
the first electrical parameter is an average of a first voltage of the first electrical calibration supply and the second electrical parameter is an average of a second voltage of the second electrical calibration supply; or
the first electrical parameter is a first amplitude of a first voltage of the first electrical calibration supply and the second electrical parameter is a second amplitude of a second voltage of the second electrical calibration supply.

3. The method of claim 1, wherein modifying the second control signal based on the first electrical parameter of the first electrical calibration supply and the second electrical parameter of the second electrical calibration supply in order to generate the modified second control signal comprises modifying the second control signal based on a difference between the first electrical parameter of the first electrical calibration supply and the second electrical parameter of the second electrical calibration supply.

4. The method of claim 3, wherein the second bonding machine is adapted to generate the modified second control signal such that a difference between
an electrical parameter of an unmodified second electrical power that the power supply would output to the second ultrasonic transducer if the second control signal instead of the modified second control signal was provided to the power supply and
an electrical parameter of the second electrical supply is equal to the difference between
the first electrical parameter of the first electrical calibration supply and
the second electrical parameter of the second electrical calibration supply.

5. The method of claim 1, wherein adapting the second bonding machine to provide the second electrical supply to the second ultrasonic transducer includes:
adapting the second bonding machine to provide a second alternating voltage and a second alternating current to the second ultrasonic transducer, the second alternating current being in phase with the second alternating voltage.

6. The method of claim 5, wherein the second alternating voltage and the second alternating current comprise zero crossings at common instants of time.

7. The method of claim 1, wherein:
the first bonding machine comprises a first tool tip distant from the first ultrasonic transducer;
the second bonding machine comprises a second tool tip distant from the second ultrasonic transducer;
damping the oscillating first ultrasonic transducer comprises mechanically damping the oscillating first ultrasonic transducer at the first tool tip; and
damping the oscillating second ultrasonic transducer comprises mechanically damping the oscillating second ultrasonic transducer at the second tool tip.

8. The method of claim 7, wherein damping the oscillating first ultrasonic transducer at the first tool tip and damping the oscillating second ultrasonic transducer at the second tool tip comprises one of:
pressing the first tool tip with a first pressing force against a first elastic pad and pressing the second tool tip with a second pressing force identical to the first pressing force against the first elastic pad or against a second elastic pad identically constructed as the first elastic pad;
pressing the first tool tip with a first pressing force against a first semiconductor chip and pressing the second tool tip with a second pressing force identical to the first pressing force against the first semiconductor chip or against a second semiconductor chip identically constructed as the first semiconductor chip;
clamping the first tool tip using a first clamp and clamping the second tool tip using the first clamp or a second clamp identically constructed as the first clamp; and
immersing the first tool tip into a first fluid and immersing the second tool tip into the first fluid or into a second fluid identical to the first fluid.

9. The method of claim 8, wherein the first elastic pad comprises, at a temperature of 23° C., a hardness of more than 60 shore-A or of more than 16 shore-D.

10. The method of claim 1, wherein damping the oscillating first ultrasonic transducer comprises:
pressing a first damping element directly against the first ultrasonic transducer or, at a same first distance from a first tool tip of the first bonding machine as the first ultrasonic transducer, against the first bonding tool; and
pressing the first damping element or a second damping element identical to the first damping element directly against the second ultrasonic transducer or, at a same second distance from a second tool tip of the second bonding machine as the second ultrasonic transducer, against the second bonding tool.

11. The method of claim 1, further comprising:
adapting the second bonding machine to store the first electrical parameter and the second electrical parameter or a parameter or a function depending on the first electrical parameter and the second electrical parameter in a memory of the second bonding machine; and
modifying the second control signal based on the stored first and second electrical parameters, based on the stored parameter or based on the stored function.

12. The method of claim 1, wherein:
providing the first electrical calibration supply to the first ultrasonic transducer comprises applying a first calibration voltage to the first ultrasonic transducer, the first calibration voltage causing a first calibration current through the first ultrasonic transducer;
providing the second electrical calibration supply to the second ultrasonic transducer comprises applying a second calibration voltage to the second ultrasonic transducer, the second calibration voltage causing a second calibration current through the second ultrasonic transducer;

the first calibration voltage and the first calibration current are in phase and comprise common zero-crossings; and the second calibration voltage and the second calibration current are in phase and comprise common zero-crossings.

13. The method of claim 12, wherein:

the first calibration voltage comprises a first fundamental frequency in a range from 20 kHz to 120 kHz; and the second calibration voltage comprises a second fundamental frequency in a range from 20 kHz to 120 kHz.

14. The method of claim 1, wherein:

the first electrical calibration supply is generated based on a first calibration control signal;

the second electrical calibration supply is generated based on a second calibration control signal identical to the first calibration control signal.

15. The method of claim 14, wherein the second control signal is different from the second calibration control signal.

16. The method of claim 1, wherein the first calibration amplitude and the second calibration amplitude are in a first lateral direction.

17. A method for calibrating a second bonding machine based on a calibrated first bonding machine, the first bonding machine comprising a first ultrasonic transducer, a first bonding tool, a first pressing device, and a first support, the second bonding machine comprising a second ultrasonic transducer and a power supply, the method comprising:

damping the first ultrasonic transducer by a first mechanical damping, the first mechanical damping including disposing a damping device on a surface of the first support and using the first pressing device to press the first bonding tool against the damping device;

providing a first electrical calibration supply to the first ultrasonic transducer, the first electrical calibration supply causing the first ultrasonic transducer, when it is damped by the first mechanical damping, to oscillate at a first calibration amplitude;

providing a second electrical calibration supply to the second ultrasonic transducer, wherein the second electrical calibration supply is configured to cause the second ultrasonic transducer, when it is damped by a second mechanical damping identical to the first mechanical damping, to oscillate at a second calibration amplitude identical to the first calibration amplitude; and adapting the second bonding machine to:

modify a second control signal based on a first electrical parameter of the first electrical calibration supply and on a second electrical parameter of the second electrical calibration supply in order to generate a modified second control signal;

provide the modified second control signal to the power supply in order to cause the power supply to generate a second electrical supply; and provide the second electrical supply to the second ultrasonic transducer.

18. The method of claim 17, wherein the damping device is an elastic pad.

19. The method of claim 18, wherein the elastic pad comprises, at a temperature of 23° C., a hardness of more than 60 shore-A or of more than 16 shore-D.

20. The method of claim 17, wherein the damping device is fluid.

* * * * *